(12) United States Patent
Son et al.

(10) Patent No.: US 12,302,701 B2
(45) Date of Patent: *May 13, 2025

(54) DISPLAY DEVICE INCLUDING LIGHT BLOCKING LAYER, METAL BLOCKING LAYER, AND INORGANIC INSULATING LAYER

(71) Applicant: Samsung Display Co., Ltd., Yongin-Si (KR)

(72) Inventors: Se Wan Son, Hwaseong-si (KR); Nak Cho Choi, Yongin-si (KR); Moo Soon Ko, Seoul (KR); Dong Hyun Son, Seoul (KR); Sang Hoon Oh, Seoul (KR); Jin Goo Jung, Seongnam-si (KR); Kyung Hyun Choi, Seoul (KR); Hae-Yeon Lee, Hwaseong-si (KR); Seong Min Cho, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/596,639

(22) Filed: Mar. 6, 2024

(65) Prior Publication Data
US 2024/0215309 A1 Jun. 27, 2024

Related U.S. Application Data

(63) Continuation of application No. 17/445,718, filed on Aug. 23, 2021, now Pat. No. 11,956,997.

(30) Foreign Application Priority Data

Oct. 22, 2020 (KR) .......................... 10-2020-0137710

(51) Int. Cl.
*H10K 59/121* (2023.01)
*H10K 50/86* (2023.01)
(Continued)

(52) U.S. Cl.
CPC ......... *H10K 59/121* (2023.02); *H10K 50/865* (2023.02); *H10K 59/122* (2023.02);
(Continued)

(58) Field of Classification Search
CPC .. H10K 59/121; H10K 50/865; H10K 59/122; H10K 59/38; H10K 59/40;
(Continued)

(56) References Cited

U.S. PATENT DOCUMENTS 10,361,255 B2   7/2019  Zeng et al.
11,956,997 B2*  4/2024  Son ....................... H10K 59/65
(Continued)

FOREIGN PATENT DOCUMENTS

KR         10-1776655 B1    9/2017
KR      10-2017-0113066 A  10/2017
(Continued)

*Primary Examiner* — J. E. Schoenholtz
(74) *Attorney, Agent, or Firm* — Innovation Counsel LLP

(57) ABSTRACT

A display device according to an exemplary embodiment includes: a substrate including a display area and a transmission area; a metal blocking layer disposed in the display area of the substrate; an inorganic insulating layer disposed on the metal blocking film; a transistor disposed on the inorganic insulating layer; an emission layer connected to the transistor; and a light blocking layer and a color filter disposed on the emission layer of the display area, wherein the edge of the light blocking layer is protruded toward the transmission area more than the edge of the metal blocking layer.

20 Claims, 19 Drawing Sheets

(51) Int. Cl.
*H10K 59/122* (2023.01)
*H10K 59/38* (2023.01)
*H10K 59/40* (2023.01)
*H10K 59/65* (2023.01)

(52) U.S. Cl.
CPC ............ *H10K 59/38* (2023.02); *H10K 59/40* (2023.02); *H10K 59/65* (2023.02)

(58) Field of Classification Search
CPC ...... H10K 59/65; H10K 50/86; H10K 59/126; H10K 59/1213; H10K 59/123; H10K 59/131; H10K 59/124; H01L 27/1248
See application file for complete search history.

(56) References Cited

U.S. PATENT DOCUMENTS

| | | | |
|---|---|---|---|
| 2014/0084293 | A1 | 3/2014 | Ahn et al. |
| 2018/0286938 | A1* | 10/2018 | Moon ................. H01L 27/1255 |
| 2021/0249492 | A1 | 8/2021 | Choi et al. |
| 2021/0359047 | A1 | 11/2021 | Yoon et al. |
| 2021/0376003 | A1* | 12/2021 | Xu ....................... H10K 50/868 |
| 2021/0399081 | A1* | 12/2021 | Park ..................... H10K 59/353 |

FOREIGN PATENT DOCUMENTS

| | | |
|---|---|---|
| KR | 10-2017-0142304 A | 12/2017 |
| KR | 10-2018-0112165 A | 10/2018 |
| KR | 10-2021-0101379 A | 8/2021 |
| KR | 10-2021-0142808 A | 11/2021 |

\* cited by examiner

DISPLAY DEVICE INCLUDING LIGHT BLOCKING LAYER, METAL BLOCKING LAYER, AND INORGANIC INSULATING LAYER

CROSS-REFERENCE TO RELATED APPLICATION

This application is a continuation application of U.S. patent application Ser. No. 17/445,718 filed on Aug. 23, 2021, now U.S. Pat. No. 11,956,997, which claims priority under 35 USC § 119 to Korean Patent Application No. 10-2020-0137710 filed in the Korean Intellectual Property Office on Oct. 22, 2020, the entire contents of which are incorporated herein by reference.

BACKGROUND

1. Field

The present disclosure relates to a display device.

2. Description of the Related Art

A display device may include an optical device such as a sensor or a camera. The optical device may be disposed in a bezel area (an area surrounding a screen) of the display device to avoid interference with the screen.

If the bezel of the display device is reduced in size, a screen-to-body ratio of the display device, that is, a ratio that the screen occupies when the display device is viewed from the front, may be increased. The screen-to-body ratio plays an important role in reflecting a technology level of the display device and simultaneously plays an important role in the consumer's choice of product.

As the bezel of the display device is reduced, it becomes difficult to dispose the optical device in the bezel area, and accordingly, a technology for disposing the optical device in the screen has been developed. In this way, when disposing the optical device in the screen, it is necessary to prevent visibility of the optical device from being lowered by light inflowing around the optical device.

On the other hand, external light incident on an organic light emitting diode display is reflected from the surface of the device, so that the contrast may be greatly reduced. Therefore, it is necessary to improve visibility by providing an antireflection unit in the organic light emitting diode display to prevent a deterioration of the contrast due to the external light. In order to prevent transmittance deterioration due to the antireflection unit, a light blocking layer may be formed in the non-light emitting portion, and a color filter that transmits light in a wavelength band similar to the light emitted from the emission layer of the emitting portion overlapping the emitting portion may be formed.

SUMMARY

A display device according to an exemplary embodiment includes: a substrate including a display area and a transmission area; a metal blocking layer disposed in the display area of the substrate; an inorganic insulating layer disposed on the metal blocking film; a transistor disposed on the inorganic insulating layer; an emission layer connected to the transistor; and a light blocking layer and a color filter disposed on the emission layer of the display area, wherein the edge of the light blocking layer may be protruded toward the transmission area more than the edge of the metal blocking layer.

The edge of the metal blocking layer may be covered by the inorganic insulating layer, and the edge of the light blocking layer may be protruded toward the transmission area more than the edge of the inorganic insulating layer.

The display device may further include an organic insulating layer disposed under the emission layer. The organic insulating layer may be disposed in the display area and the transmission area.

The inorganic insulating layer may be at least partially removed in the transmission area.

The metal blocking layer may have a first opening overlapping the transmission area, the light blocking layer may have a second opening overlapping the transmission area, and the area of the second opening may be smaller than the area of the first opening.

The plane shape of the first opening and the second opening may be similar.

The first opening may have a plane shape of a cross shape, and the edge of the metal blocking layer may have a plane shape in which a concave portion and a convex portion are repeated.

The first opening of the metal blocking layer may have a circular or elliptical plane shape.

The display device may have a pixel definition layer disposed on the transistor and defining the area of the emission layer, and a spacer disposed on the pixel definition layer. The spacer may be positioned between the display area and the transmission area and disposed on the edge of the metal blocking layer.

The spacer may have a plane shape of a polygon.

The spacer may have a plane shape of a curved shape.

The space may have a plane shape selected from a triangle, a rectangle, an ellipse, and a circle.

A display device according to an exemplary embodiment includes: a first display area including a first pixel area; a second display area including a second pixel area and a transmission area adjacent to each other; an optical device overlapping the second display area; a light blocking layer and a color filter first disposed in the first pixel area and the second pixel area; and a metal blocking layer disposed on the second pixel area, wherein the edge of the light blocking layer may be protruded toward the transmission area more than the edge of the metal blocking layer.

A display device according to an exemplary embodiment includes: a substrate including a display area and a transmission area; a metal blocking layer disposed in the display area of the substrate; an inorganic insulating layer disposed on the metal blocking film; a transistor disposed on the inorganic insulating layer; a pixel definition layer disposed on the transistor; an emission layer disposed in an area defined by the pixel definition layer; and a spacer disposed on the pixel definition layer, wherein the spacer may be disposed between the display area and the transmission area, and the spacer may be disposed adjacent to the edge of the metal blocking layer.

DETAILED DESCRIPTION

Figure 1:
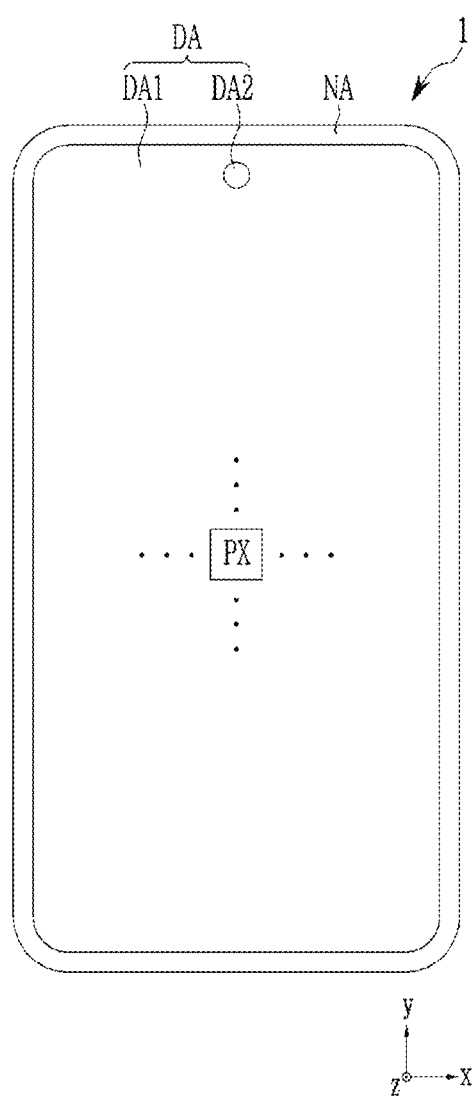
FIG. 1 is a schematic top plan view of a display device according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In describing the present invention, parts that are not related to the description will be omitted. Like reference numerals generally designate like elements throughout the specification.

In addition, the size and thickness of each configuration shown in the drawings are arbitrarily shown for better understanding and ease of description, but the present invention is not limited thereto. In the drawings, the thickness of layers, films, panels, areas, etc., are exaggerated for clarity. In the drawings, for better understanding and ease of description, the thicknesses of some layers and areas are exaggerated.

It will be understood that when an element such as a layer, film, area, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Throughout the specification, the phrase "on a plane" means viewing the object portion from the top, and the phrase "on a cross-section" means viewing a cross-section of which the object portion is vertically cut from the side.

In addition, in the specification, when referring to "connected to", this does not mean only that two or more constituent elements are directly connected to each other, but the two or more constituent elements may be indirectly connected and physically connected through other constituent elements, and they may also be electrically connected or referred to by different names depending on the position or function, and may mean that they are one body.

In a drawing, a symbol x used to indicate a direction is a first direction, a symbol y is a second direction which is vertical to the first direction and a symbol z is a third direction which is vertical to the first direction and the second direction.

A display device according to an exemplary embodiment is schematically described with reference to FIG. 1 and FIG. 2. FIG. 1 is a schematic top plan view of a display device according to an exemplary embodiment, and FIG. 2 is a schematic cross-sectional view of a display device according to an exemplary embodiment.

Figure 2:
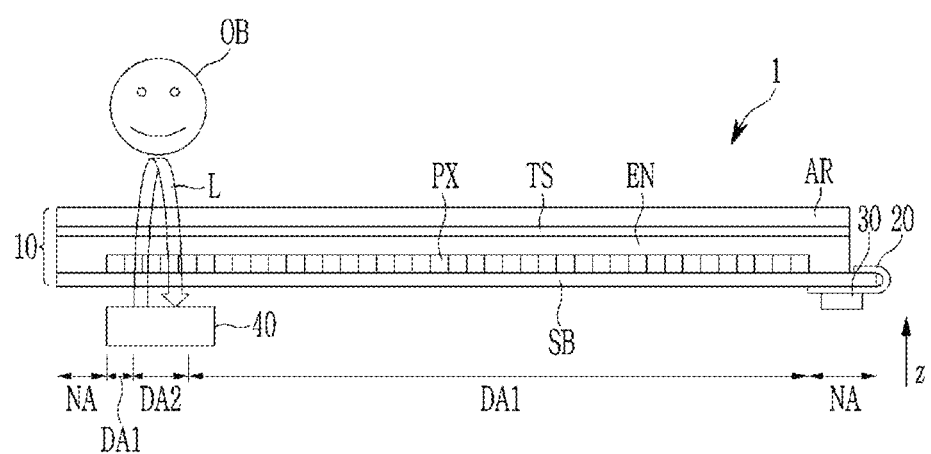
FIG. 2 is a schematic cross-sectional view of a display device according to an exemplary embodiment.

Referring to FIG. 1 and FIG. 2, a display device 1 may include a display panel 10, a flexible printed circuit film 20 connected to the display panel 10, a driving unit including an integrated circuit chip 30 and the like, and an optical device 40.

The display panel 10 may include a display area DA where an image is displayed and a non-display area NA disposed to surround the display area DA and in which the image is not displayed. The display area DA may correspond to a screen. The display panel 10 displays the image and detects a touch.

A plurality of pixels PX are positioned in the display area DA. Here, the pixel PX is a minimum unit that displays the image, and each pixel PX may display a specific color, for example one color among red, green, and blue, according to an input image signal, with various luminances.

In the non-display area NA, circuits and/or signal lines for generating and/or transmitting various signals applied to the display area DA are disposed. Signal lines such as a gate line, a data line, a driving voltage line, and the like are connected to each pixel PX, and the pixel PX may receive a gate signal, a data voltage, a driving voltage, and the like from these signal lines.

The display area DA includes a first display area DA1 and a second display area DA2. The second display area DA2 has higher transmittance than the first display area DA1 so that it may perform other functions besides a unique function of displaying an image. Here, the transmittance means a transmittance of light passing through the display panel 10 in a third direction z. The light may be visible light and/or light with a wavelength other than visible light (e.g., an infrared light). The second display area DA2 has a smaller density of the pixels PX than the first display area DA1, that is, the number of pixels PX per unit area.

In the display area DA, the second display area DA2 may be disposed in various ways. In the exemplary embodiment shown, the second display area DA2 is disposed within the first display area DA1 and is surrounded by the first display area DA1.

The second display area DA2 may be disposed in contact with the non-display area NA, for example, may be disposed to be divided into two or more areas at the left, right, and/or center in the top of the display area DA. The second display area DA2 may be disposed completely across the top of the display area DA along the first direction x, or may be disposed along the second direction y across the left end and/or the right end of the display area DA. The second display area DA2 may have various shapes such as a rectangle, a triangle, a polygon, a circle, and an oval.

In the non-display area NA of the display panel 10, a driving unit that generates and/or processes various signals for driving the display panel 10 may be disposed. The driving unit may include a data driver for applying a data voltage to the data lines, a gate driver for applying a gate signal to the gate lines, and a signal controller for controlling the data driver and the gate driver.

The driver may be integrated on the display panel 10, and may be disposed on both sides or one side of the display area DA. The data driver and the signal controller may be provided as an integrated circuit chip (also called a driving IC chip) 30, and the integrated circuit chip 30 may be mounted on a flexible printed circuit film 20 and electrically connected to the display panel 10. The integrated circuit chip 30 may be mounted on the non-display area NA of the display panel 10.

The display panel 10 may include a substrate SB, and a plurality of pixels PX may be formed on the substrate SB. The substrate SB may be disposed continuously across the first display area DA1 and the second display area DA2.

The display panel 10 may include an encapsulation layer EC covering all the pixels PX. The encapsulation layer EC seals the first display area DA1 and the second display area DA2 to prevent moisture or oxygen from entering the display panel 10.

A touch sensor layer TS may be positioned on the encapsulation layer EC. The area of the touch sensor layer TS capable of detecting a touch may approximately coincide with the display area DA.

Touch electrodes (not shown) may be positioned in the touch sensor layer TS. One touch electrode may be disposed throughout a plurality of pixels PX. The touch electrode may be composed of a metal mesh. The touch electrode may be formed of a metal material such as titanium, aluminum, copper, molybdenum, or a transparent conductive material such as indium tin oxide (ITO) or indium zinc oxide (IZO). The touch electrode may be formed of a single layer or multiple layers.

The touch electrodes may detect a user's contact or non-contact touch. Each touch electrode may sense a touch in a self-capacitor method, or adjacent touch electrodes may sense a touch in a mutual capacitor method. The display panel 10 may be called a touch screen panel. The display device 1 may include a touch driver that generates signals for driving the touch electrodes and processes the signals received from the touch electrodes, and the touch driver may be provided as an integrated circuit chip.

An anti-reflection layer AR for reducing a reflection of external light may be disposed on the touch sensor layer TS. The anti-reflection layer AR may include a light blocking member and a color filter. The anti-reflection layer AR is described more in detail later.

The optical device 40 may be disposed to overlap the display panel 10 on the back of the display panel 10, and may be disposed to correspond to the entire second display area DA2 or only the portion of the second display area DA2. Also, in the second display area DA2, a plurality of optical devices 40 may be disposed.

The optical device 40 may be a camera, sensor, or flash, and when the optical device 40 is a sensor, the optical device 40 may be a proximity sensor or an illuminance sensor. Light of the wavelength used by the optical device 40 may pass through the display panel 10 with higher transmittance through the second display area DA2.

The optical device 40 may emit light L of a predetermined wavelength range toward an object OB disposed in front of the display panel 10 or receive light L reflected from the object OB. The light L of the predetermined wavelength range is light of a wavelength that may be processed by the optical device 40, and may be visible light and/or infrared light, and the light of the predetermined wavelength may mainly pass through the transmission area disposed in the second display area DA2. For example, when the optical device 40 uses the infrared light, the predetermined wavelength of the light may have be in a wavelength area of about 900 nm to 1000 nm. The optical device 40 may receive the light of the predetermined wavelength irradiated on the front surface of the display panel 10.

In addition to the optical device 40, various electronic devices may be positioned on the back of the display panel 10.

Figure 3:
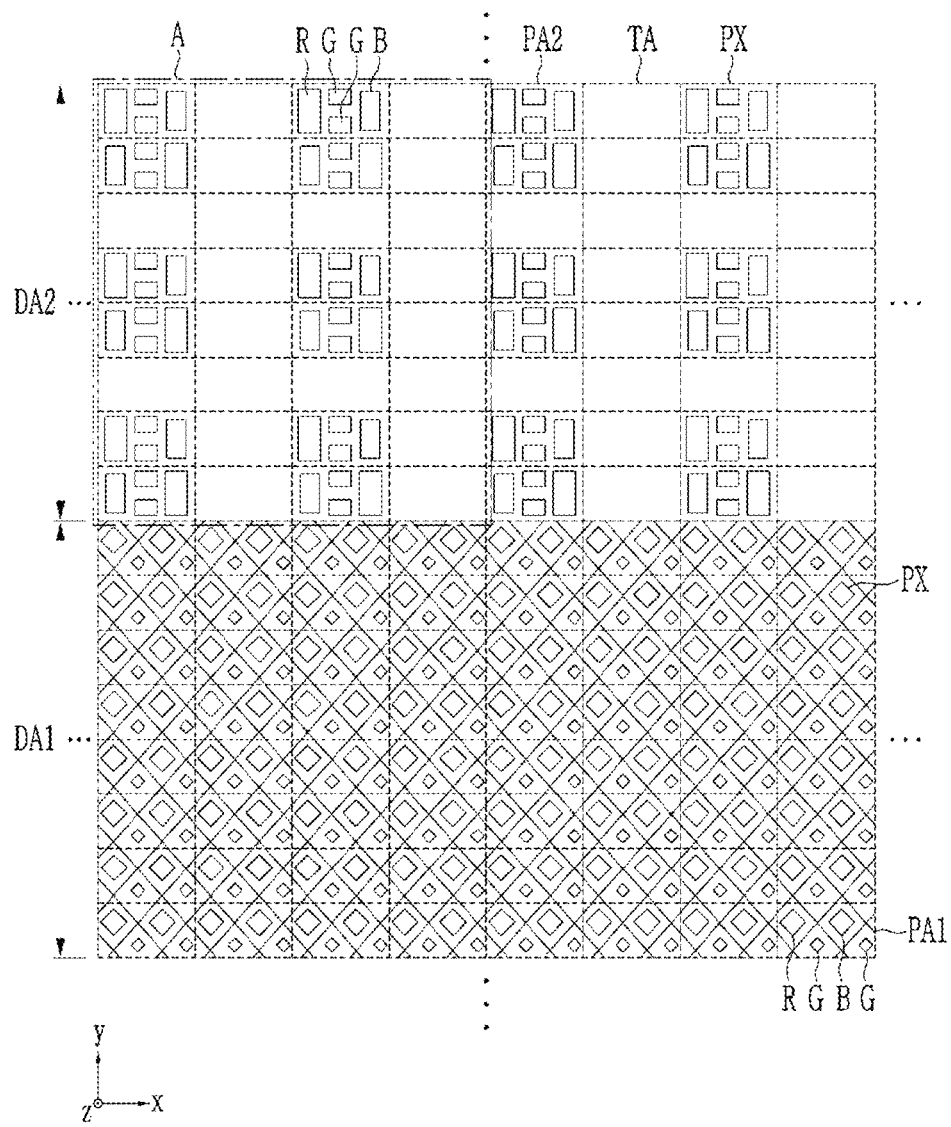
FIG. 3 is a schematic layout view of a first display area and a second display area of a display device according to an exemplary embodiment.

The first display area DA1 and the second display area DA2 of the display device 1 according to an exemplary embodiment is described with reference to FIG. 3 along with FIG. 1 and FIG. 2. FIG. 3 is a schematic layout view of a first display area and a second display area of a display device according to an exemplary embodiment.

Referring to FIG. 3, the first display area DA1 includes a plurality of first pixel areas PA1, and the second display area DA2 includes a plurality of second pixel areas PA2 and a plurality of transmission areas TA.

The size of one first pixel area PA1 and the size of one second pixel area PA2 may be different, but are not limited thereto, and the size of one first pixel area PA1 and the size of one second pixel area PA2 may be the same.

Each pixel area PA1 and PA2 may include at least one pixel PX. The pixel PX may include a pixel circuit and a light emitting unit. The pixel circuit is a circuit for driving a light emitting element such as a light emitting diode (LED) and may include a transistor, a capacitor, etc. The light emitting unit is an area from which light emitted from a light emitting element is emitted. In addition, in the second display area DA2, the pixel circuit may be positioned in the non-display area, and the pixel circuit may be positioned in a separate space positioned in the first display area DA1. The pixel circuit and second pixel areas PA2 are connected to each other through a connection wire made of a transparent metal, which may increase the efficiency of the optical device.

The pixel PX shown in FIG. 3 may correspond to the light emitting unit. The light emitting unit can have various shapes such as a rhombus, rectangle, and circle. The pixel PX may emit light in one direction, that is, the third direction (z).

The transmission area TA does not include the element circuit and the light emitting unit. In the transmission area TA, the pixel circuit, the light emitting unit, the touch electrode, etc., which interfere the transmission of light, are not positioned or rarely positioned, so the transmittance is higher than that of the first pixel areas PA1 and the second pixel areas PA2.

Wiring areas are positioned around the second pixel areas PA2, and a plurality of signal lines for transmitting the signals to the pixel PX may be positioned in the first pixel area PA1 and the second pixel area PA2, and the wiring areas.

According to an exemplary embodiment shown in FIG. 3, each first pixel area PA1 includes one red pixel R, two green pixels G, and one blue pixel B. Each second pixel area PA2 includes one red pixel R, two green pixels G, and one blue pixel B.

The arrangement of the red pixel R, the green pixel G, and the blue pixel B of the first pixel area PA1 and the arrangement of the red pixel R, the green pixel G, and the blue pixel B of the second pixel area PA2 may be different from each other, and the size of the red pixel R, the green pixel G, and the blue pixel B of the first pixel area PA1 and the size of the red pixel R, the green pixel G, and the blue pixel B of the second pixel area PA2 may be different from each other. Unlike as illustrated, the pixel arrangement of the first pixel area PA1 and the pixel arrangement of the second pixel area PA2 may be the same.

If the group of the pixels R, G, and B included in each pixel area PA1 and PA2 is called a unit pixel, the configurations of the unit pixel of the first pixel area PA1 and the unit pixel of the second pixel area PA2 may be the same or may be different. The unit pixel may include one red pixel R, one green pixel G, and one blue pixel B. The unit pixel may include at least one of the red pixel R, the green pixel G, and the blue pixel B and may include a white pixel.

The pixels R, G, and B included in the first display area DA1 form a pixel row in the first direction x. In each pixel row in the first display area DA1, the pixels R, G, and B are arranged in an approximate line in the first direction x. In each pixel row, the pixels R, G, and B may be repeatedly arranged in the order of the red pixel R, the green pixel G, the blue pixel B, and the green pixel G in the first direction x. The arrangement of the pixels R, G, and B included in one pixel row may be variously changed. For example, the pixels R, G, and B may be arranged repeatedly in the order of the blue pixel B, the green pixel G, the red pixel R, and the green pixel G in the first direction x, or may be repeatedly arranged in the order of the red pixel R, the blue pixel B, the green pixel G, and the blue pixel B.

In each pixel row in the second display area DA2, the pixels R, G, and B are arranged in an approximate line in the first direction x. In each pixel row, for the pixels R, G, and B, one red pixel R, two green pixels G, and one blue pixel B may be repeatedly arranged in the first direction x. The arrangement of the pixels R, G, and B included in one pixel row may be variously changed. In the second display area DA2, each pixel PX may have a rectangular planar shape.

The planar size of the green pixel G and the planar size of the blue pixel B may be smaller than that of the red pixel R.

The pixels R, G, and B of the first and second pixel areas PA1 and PA2 also form a pixel column in the second direction y. In each pixel column, the pixels R, G, and B are arranged in an approximate line in the second direction y. In each pixel column, the pixels PX of the same color may be disposed, and the pixels PX of two or more colors may be disposed alternately in the second direction y. The arrangement of the pixels R, G, and B included in one pixel column may be variously changed.

The pixels R, G, and B of the second pixel area PA2 may be a single-side emission type, for example a top emission type emitting light in the third direction z. The pixels R, G, and B of the second pixel area PA2 may be of a bottom emission type or a double-sided emission type.

Figure 4:
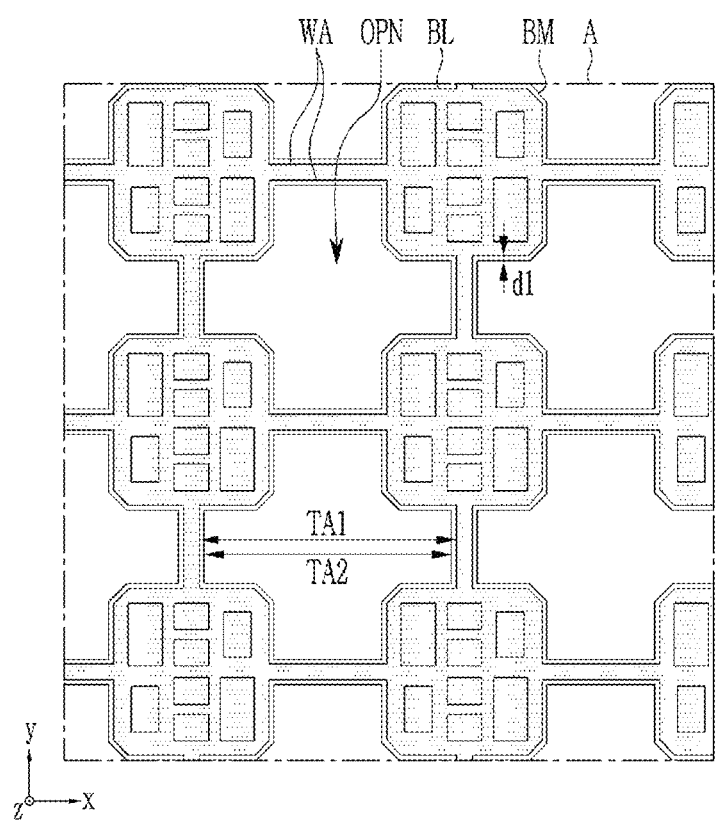
FIG. 4 is a schematic enlarged view of a second pixel area of a display device according to an exemplary embodiment.

Next, the second pixel area PA2 and the transmission area TA in the second display area DA2 are described with reference to FIG. 4 along with FIG. 3. FIG. 4 is a schematic enlarged view of a second pixel area of a display device according to an exemplary embodiment and the enlarged view of the area A of FIG. 3.

Referring to FIG. 4 along with FIG. 3, in the second display area DA2, the second pixel area PA2 and the transmission area TA are adjacent to each other, and the second pixel area PA2 includes the pixels R, G, and B. The second display area DA2 further includes a plurality of wiring areas WA disposed between a plurality of second pixel areas PA2 and a plurality of transmission areas TA. Each of a plurality of wiring areas WA is positioned to surround a plurality of transmission areas TA. Although not shown, the signal lines such as a gate line and a data line for transmitting the signals to the pixels R, G, and B of the second pixel area PA2 are positioned in the wiring area WA disposed at the boundary of the transmission areas TA so that the transmittance of the transmission area TA is not deteriorated.

The metal blocking layer BL and the light blocking layer BM are positioned in the second pixel area PA2, and the metal blocking layer BL and the light blocking layer BM have an opening OPN positioned in the transmission area TA. The metal blocking layer BL and the light blocking layer BM may also be disposed in the wiring area WA. The metal blocking layer BL and the light blocking layer BM are also positioned in the wiring area WA, which is positioned to surround the transmission area TA to prevent the light passing through the transmission area TA from diffracting around the transmission area TA, thereby preventing quality of the optical device 40 (FIG. 2) from being deteriorated by the surrounding light.

According to the exemplary embodiment of FIG. 4, the opening OPN of the metal blocking layer BL and the light blocking layer BM has an approximate cross-shaped plane shape, and an upper protruded part, a lower protruded part, a left protruded part, and a right protruded part of the cross-shaped opening OPN may be about the same size.

The blocking layer BL may include a metal, and may prevent light inflowing from outside from inflowing to the second pixel area PA2 and prevent light passing through the transmission area TA from diffracting around the transmission area TA. The metal blocking layer BL may include a metal oxide.

On a plane, the edge of the light blocking layer BM is protruded by a first interval d1 more than the edge of the metal blocking layer BL, and it may be prevented that the light is diffracted and scattered by the insulating layers positioned around the edge of the metal blocking layer BL and is recognized around the metal blocking layer BL.

The transmission area TA may have the first transmission area TA1 surrounded by the metal blocking layer BL and the second transmission area TA2 surrounded by the light blocking layer BM, and the area of the second transmission area TA2 may be narrower than the area of the first transmission area TA1.

The blocking layer BL and the opening OPN of the light blocking layer BM is formed in the approximate cross shape in which the sizes of the upper protruded part, the lower protruded part, the left protruded part, and the right protruded part are the almost same, so that an effect of the light diffraction that may occur around the opening OPN may be reduced.

The blocking layer BL and the light blocking layer BM are disposed to overlap the wiring area WA where the signal lines for transmitting the signals to the second pixel area PA2 are positioned, so that it is possible to prevent light from inflowing to the signal lines disposed in the wiring area WA and to prevent light from being reflected from the lines surface and recognized at the transmission area TA side.

Figure 5:
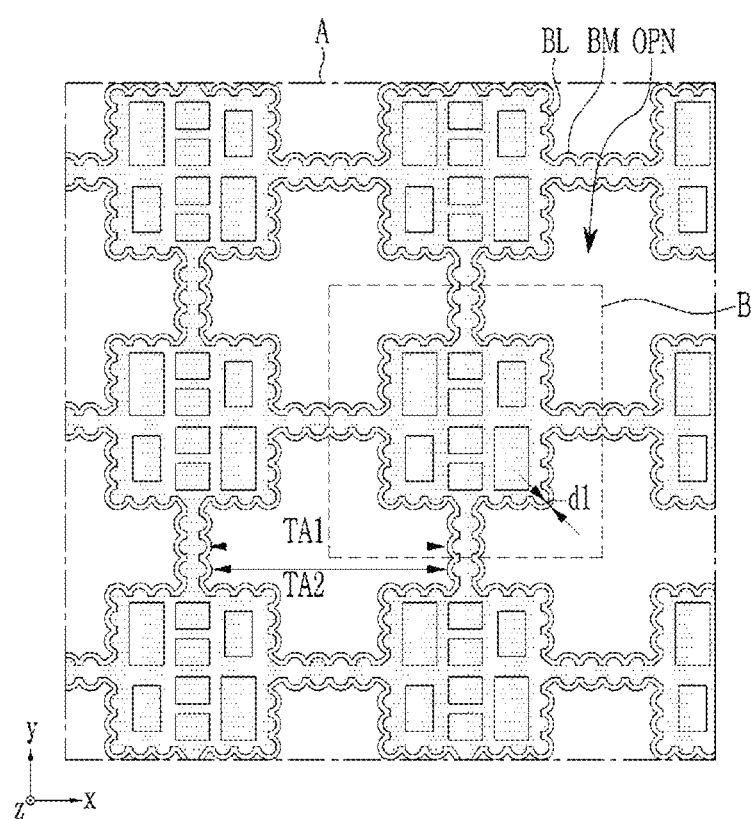
FIG. 5 is a schematic enlarged view of a second pixel area of a display device according to another exemplary embodiment.

Next, the second pixel area PA2 of the display device according to another exemplary embodiment is described with reference to FIG. 5 along with FIG. 3. FIG. 5 is a schematic enlarged view of a second pixel area of a display device according to another exemplary embodiment and is the enlarged view of the area A of FIG. 3.

Referring to FIG. 5 together with FIG. 3, the metal blocking layer BL and the opening OPN of the light blocking layer BM in the second pixel area PA2 of the display device according to another exemplary embodiment has the planar shape of the approximate cross shape, and the upper protruded part, the lower protruded part, the left protruded part, and the right protruded part of the opening OPN of the cross shape may have almost the same size.

The blocking layer BL and the opening OPN of the light blocking layer BM is formed in the approximate cross shape with almost the same size of the upper protruded part, the lower protruded part, the left protruded part, and the right protruded part, so that it is possible to reduce the effect of the diffraction of light that may occur around the opening OPN.

On a plane, the edge of the light blocking layer BM is more protruded than the edge of the metal blocking layer BL, so that it may be prevented that the light is diffracted and scattered by the insulating layers positioned around the edge of the metal blocking layer BL and is recognized around the metal blocking layer BL.

The metal blocking layer BL and the light blocking layer BM are disposed to overlap the wiring area WA where the signal lines for transmitting the signals to the second pixel area PA2 are positioned, so that it is possible to prevent light from inflowing to the signal lines disposed in the wiring area WA and to prevent light from being reflected from the lines surface and recognized at the transmission area TA side.

In addition, the edge of the opening OPN is not a straight line, but may have an embossed shape in which a recess portion and a convex portion are repeated. By forming the edge of the opening OPN not in the straight line, but in the embossed shape in which the recess portion and the convex portion are repeated, the effect of the light diffraction that may occur around the opening OPN may be reduced.

Figure 6:
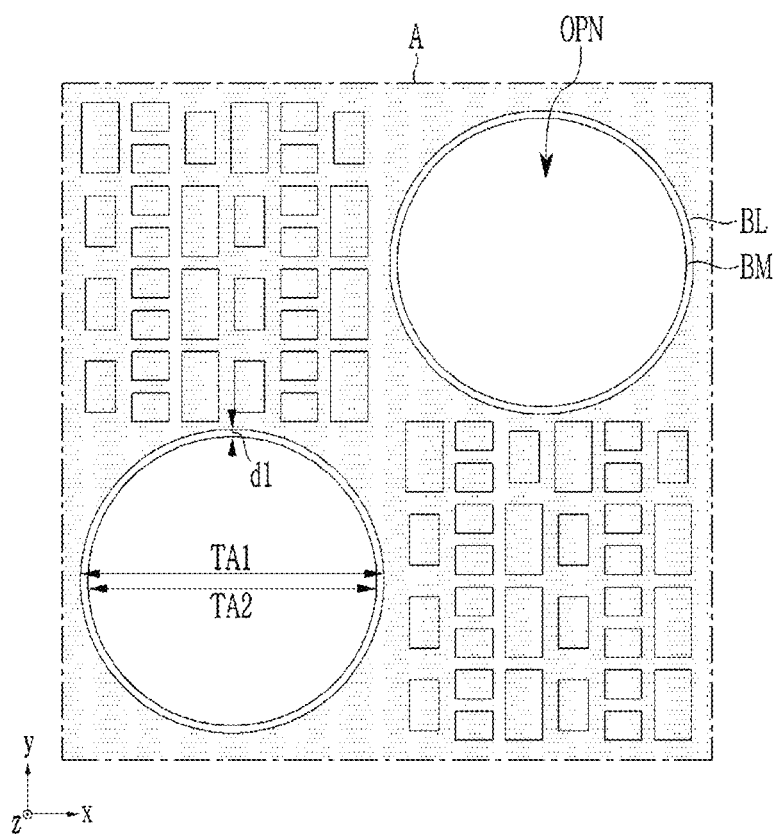
FIG. 6 is a schematic enlarged view of a second pixel area of a display device according to another exemplary embodiment.

Now, the second pixel area PA2 of the display device according to another exemplary embodiment is described with reference to FIG. 6. FIG. 6 is a schematic enlarged view of a second pixel area of a display device according to another exemplary embodiment.

Referring to FIG. 6, the metal blocking layer BL and the opening OPN of the light blocking layer BM has an approximate circular planar shape. The metal blocking layer BL and the opening OPN of the light blocking layer BM may have an approximate elliptical planar shape.

The blocking layer BL may include a metal, and may prevent light inflowing from outside from inflowing to the second pixel area PA2 and prevent light passing through the transmission area TA from diffracting around the transmission area TA.

By forming the blocking layer BL and the opening OPN of the light blocking layer BM to have the approximate circular or elliptical planar shape, the effect of the light diffraction that may occur around the opening OPN of the metal blocking layer BL may be reduced.

On a plane, the edge of the light blocking layer BM is more protruded than the edge of the metal blocking layer BL, so that it may be prevented that the light is diffracted and scattered by the insulating layers positioned around the edge of the metal blocking layer BL and is recognized around the metal blocking layer BL.

The metal blocking layer BL and the light blocking layer BM are disposed to overlap the wiring area WA where the signal lines for transmitting the signals to the second pixel area PA2 are positioned, so that it is possible to prevent light from inflowing to the signal lines disposed in the wiring area WA and to prevent light from being reflected from the lines surface and recognized at the transmission area TA side.

Figure 7:
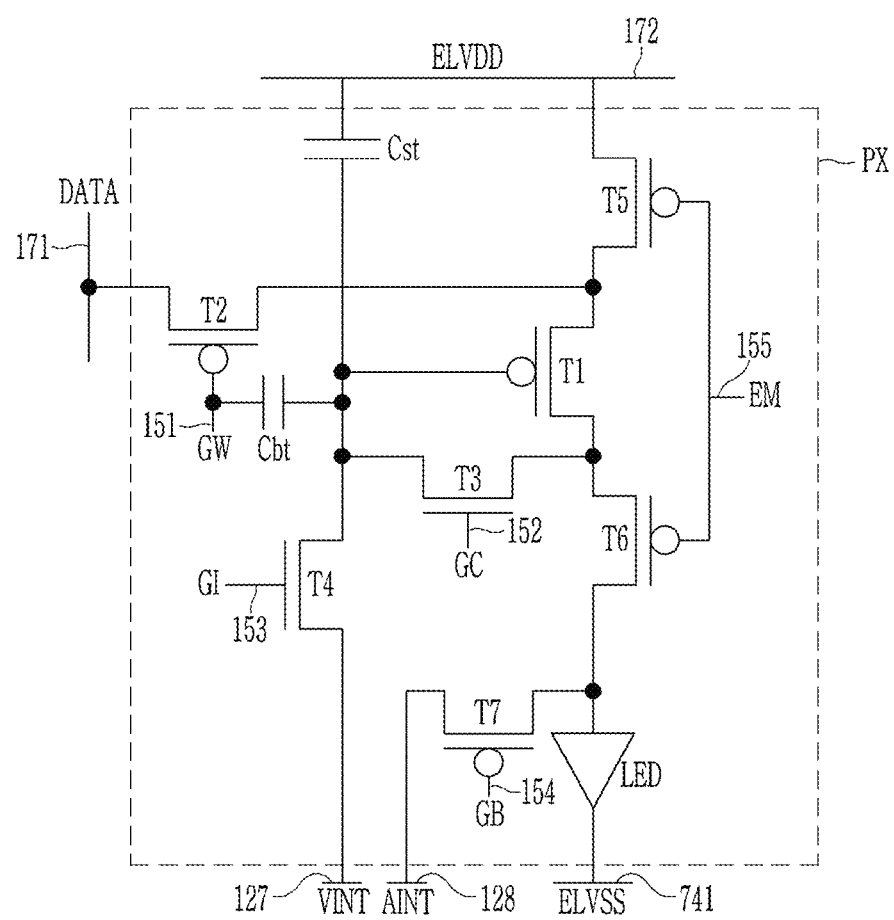
FIG. 7 is a circuit diagram of one pixel of a display device according to an exemplary embodiment.

A pixel circuit of one pixel of the display areas DA1 and DA2 of the display device according to an exemplary embodiment is now described with reference to FIG. 7. FIG. 7 is a circuit diagram of one pixel of a display device according to an exemplary embodiment.

As shown in FIG. 7, one pixel PX of the display device according to an exemplary embodiment includes a plurality of transistors T1, T2, T3, T4, T5, T6, and T7 connected to several wires 127, 128, 151, 152, 153, 154, 155, 171, 172, and 741, a storage capacitor Cst, a boost capacitor Cbt, and a light emitting diode (LED).

The plurality of wires 127, 128, 151, 152, 153, 154, 155, 171, 172, and 741 are connected to one pixel PX. The plurality of wires include a first initialization voltage line 127, a second initialization voltage line 128, a first scan line 151, a second scan line 152, an initialization control line 153, a bypass control line 154, a light emission control line 155, a data line 171, a driving voltage line 172, and a common voltage line 741.

The first scan line 151 is connected to the gate driver (not shown) to transmit a first scan signal GW to a second transistor T2. The second scan line 152 may be applied with a voltage of an opposite polarity to the voltage applied to the first scan line 151 at the same time as the signal of the first scan line 151. For example, when a negative voltage is applied to the first scan line 151, a positive voltage may be applied to the second scan line 152. The second scan line 152 transmits a second scan signal GC to the third transistor T3.

The initialization control line 153 transmits an initialization control signal GI to the fourth transistor T4. The bypass control line 154 transmits a bypass signal GB to the seventh transistor T7. The bypass control line 154 may consist of the first scan line 151 of the previous stage. The light emission control line 155 transmits a light emission control signal EM to the fifth transistor T5 and the sixth transistor T6.

The data line 171 is a wire transmitting a data voltage DATA generated from a data driver (not shown), and a luminance emitted by the light emitting diode (LED) is changed depending on the data voltage DATA applied to the pixel PX.

The driving voltage line 172 applies the driving voltage ELVDD. The first initialization voltage line 127 transmits the first initialization voltage VINT, and the second initialization voltage line 128 transmits the second initialization voltage AINT. The common voltage line 741 applies the common voltage ELVSS to the cathode of the light emitting diode (LED). In the present exemplary embodiment, the voltages applied to the driving voltage line 172, the first and second initialization voltage lines 127 and 128, and the common voltage line 741 may be a constant voltage, respectively.

The plurality of transistors may include a driving transistor T1, a second transistor T2, a third transistor T3, a fourth transistor T4, a fifth transistor T5, a sixth transistor T6, and a seventh transistor T7. The plurality of transistors may include oxide transistors including an oxide semiconductor and polycrystalline transistors including a polycrystalline semiconductor. For example, the third transistor T3 and the fourth transistor T4 may be made of the oxide transistor, and the driving transistor T1, the second transistor T2, the fifth transistor T5, the sixth transistor T6, and the seventh transistor T7 may be made as the polycrystalline transistor. However, the embodiment is not limited thereto, and a plurality of transistors may all be made as the polycrystalline transistor.

In the above, it has been described that one pixel PX includes seven transistors T1 to T7, one storage capacitor Cst, and one boost capacitor Cbt, but is not limited thereto, and the number of the transistors and the capacitors and the connection relationship thereof may be changed in various ways.

Figure 8:
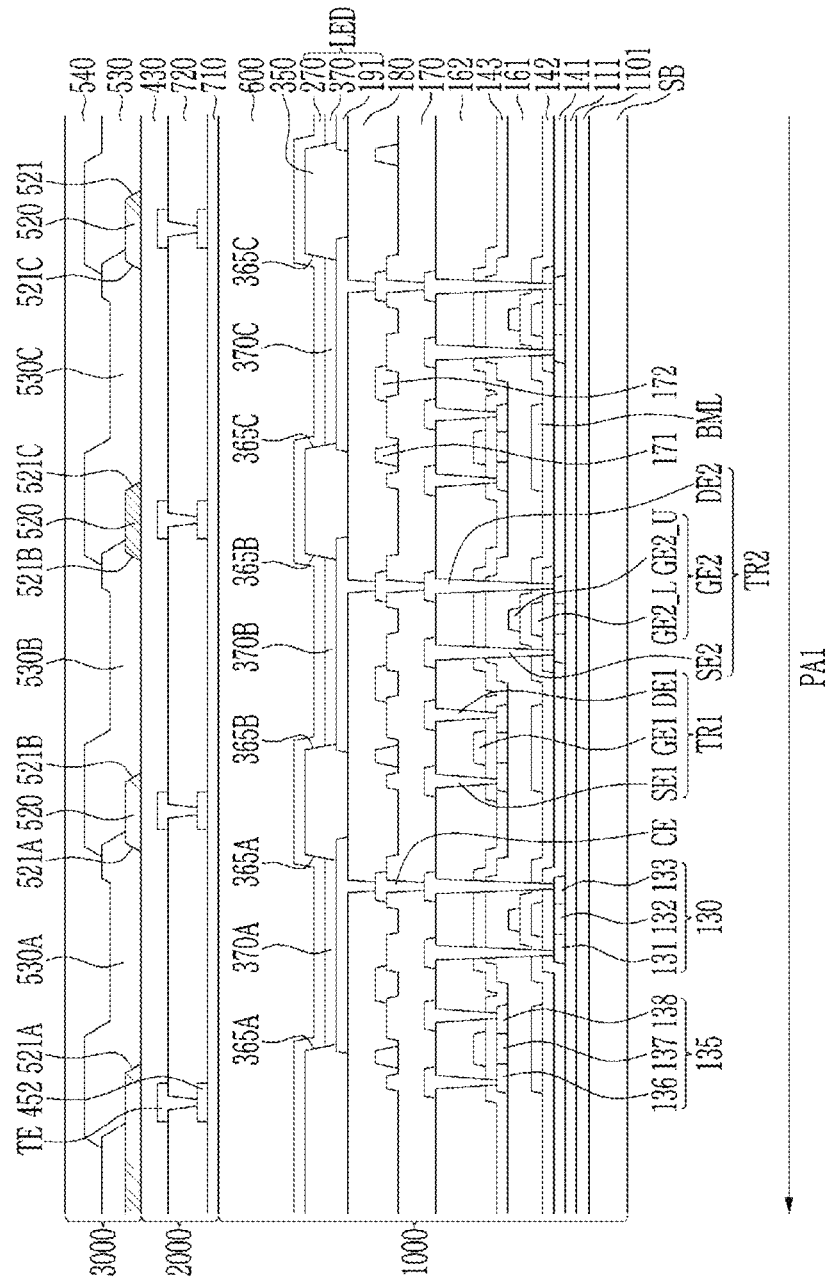
FIG. 8 is a cross-sectional view of a first display area of a display device according to an exemplary embodiment.

The first display area and the second display area of the display device according to an exemplary embodiment are now described in more detail with reference to FIG. 8 and FIG. 9. FIG. 8 is a cross-sectional view of a first display area of a display device according to an exemplary embodiment, and FIG. 9 is a cross-sectional view of a second display area of a display device according to an exemplary embodiment.

Figure 9:
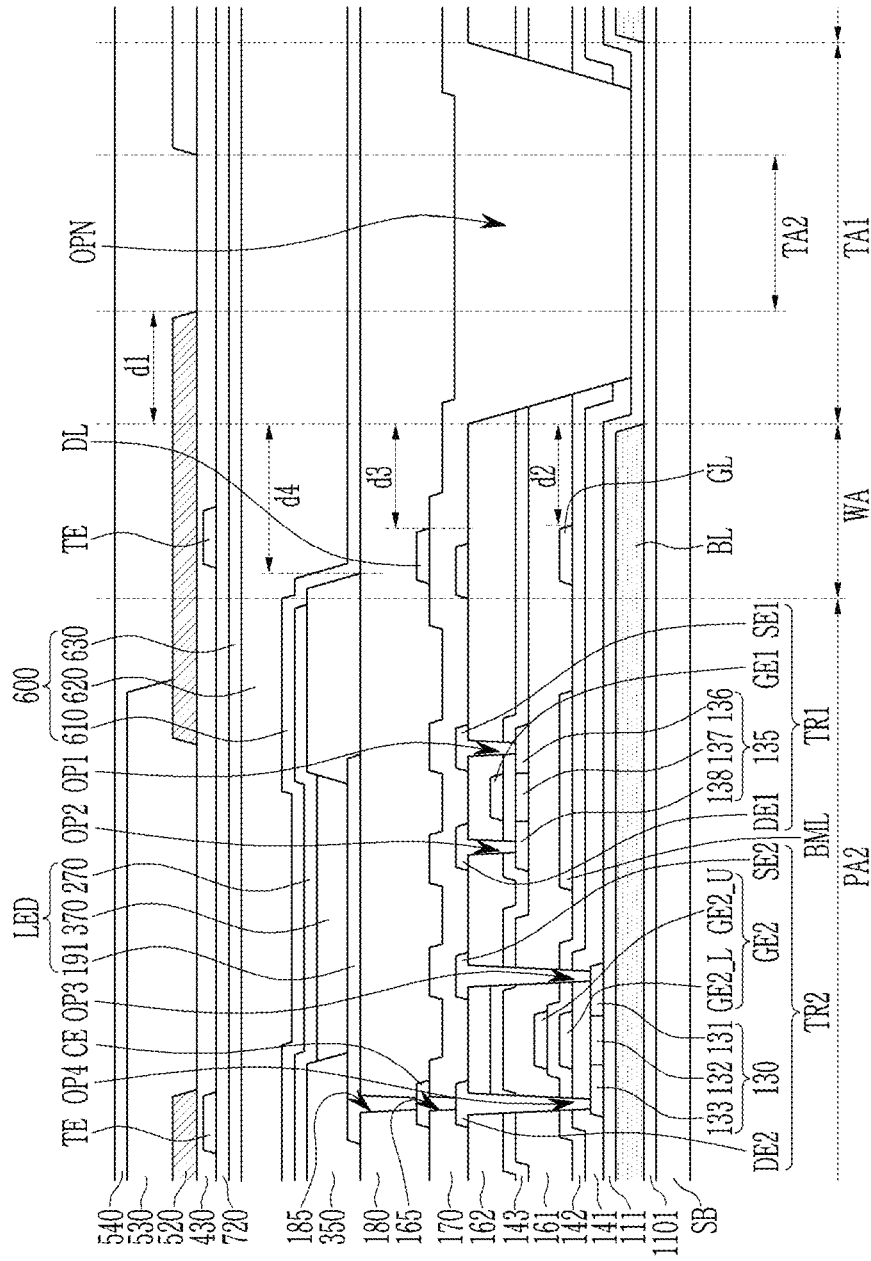
FIG. 9 is a cross-sectional view of a second display area of a display device according to an exemplary embodiment.

According to an exemplary embodiment shown in FIG. 8 and FIG. 9, for better comprehension and ease of description, the first transistor TR1, the second transistor TR2, and the light emitting diode (LED) connected to the second transistor TR2 have been mainly described, but it is not limited thereto, and as shown in FIG. 7, the other transistors as well as the first transistor TR1 and the second transistor TR2 may be included. The first transistor TR1 may be a switching transistor, and the second transistor TR2 may be a driving transistor, but are not limited thereto.

First, referring to FIG. 8, the first pixel area PA1 of the first display area DA1 of the display device according to an exemplary embodiment includes a display unit 1000, a touch unit 2000, and an antireflection unit 3000. The touch unit 2000 may be disposed between the display unit 1000 and the antireflection unit 3000.

The substrate SB may include an insulating material such as a polymer such as a polyimide and a polyamide, or glass, and may be optically transparent.

The substrate SB may include a first layer (not shown) and a second layer (not shown) overlapping each other, and a first barrier layer (not shown) positioned between the first layer and the second layer.

The first layer and the second layer may include polymers such as polyimide and polyamide. The first layer and the second layer may include at least one among polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The first barrier layer may prevent penetration of moisture, etc., and may include inorganic insulating materials such as a silicon oxide (SiOx), a silicon nitride (SiNx), and a silicon oxynitride (SiOxNy). The first barrier layer 1100 may include amorphous silicon (Si).

A second barrier layer 1101 is disposed on the substrate SB.

The second barrier layer 1101 plays a role of flattening the surface while simultaneously preventing the penetration of unnecessary components such as impurities or moisture. The second barrier layer 1101 may include at least one of a silicon oxide, a silicon nitride, a silicon oxynitride, and amorphous silicon.

A buffer layer 111 may be disposed on the second barrier layer 1101.

The buffer layer 111 is positioned between the substrate SB and the semiconductor layer 130 to block impurity from the substrate SB during the crystallization process to form a polysilicon, thereby improving the polysilicon characteristics.

The buffer layer 111 may include an inorganic insulating material such as a silicon oxide (SiOx), a silicon nitride (SiNx), and a silicon oxynitride (SiOxNy). The buffer layer 111 may include amorphous silicon (Si).

A second semiconductor 130 may be disposed on the buffer layer 111. The second semiconductor 130 may include a polycrystalline silicon material. That is, the second semiconductor 130 may be formed of a polycrystalline semiconductor. The second semiconductor 130 may include a source area 131, a channel area 132, and a drain area 133.

The source area 131 of the second semiconductor 130 may be connected to the second source electrode SE2, and the drain area 133 of the second semiconductor 130 may be connected to the second drain electrode DE2.

A first gate insulating layer 141 may be disposed on the second semiconductor 130. The first gate insulating layer 141 may have a single layer or multi-layered structure including a silicon nitride, a silicon oxide, a silicon oxynitride, and the like.

A second gate lower electrode GE2_L may be disposed on the first gate insulating layer 141. The second gate lower electrode GE2_L may include molybdenum (Mo), aluminum (Al), copper (Cu), and/or titanium (Ti), and may have a single layer or multi-layered structure including the same.

A second gate insulating layer 142 may be positioned on the second gate lower electrode GE2_L. The second gate insulating layer 142 may include a silicon nitride, a silicon oxide, a silicon oxynitride, and the like. The second gate insulating layer 142 may have a single layer or multi-layered structure including a silicon nitride, a silicon oxide, and a silicon oxynitride.

A second gate upper electrode GE2_U may be positioned on the second gate insulating layer 142. The second gate lower electrode GE2_L and the second gate upper electrode GE2_U may overlap via the second gate insulating layer 142. The second gate upper electrode GE2_U and the second gate lower electrode GE2_L configure the second gate electrode GE2. The second gate electrode GE2 may overlap the channel area 132 of the second semiconductor 130 in the direction vertical to the substrate SB.

The second gate upper electrode GE2_U and the gate line (GL) may include molybdenum (Mo), aluminum (Al), copper (Cu), silver (Ag), chromium (Cr), tantalum (Ta), titanium (Ti), etc., and may be a single layer or multi-layered structure including the same.

On the second gate insulating layer 142, a metal layer BML composed of the same layer as the second gate upper electrode GE2_U and the gate line GL may be positioned, and the metal layer BML may overlap the first transistor TR1, which is described later. The metal layer BML may be connected to the driving voltage line, or the gate electrode or the source electrode of the first transistor TR1, so it may act as the lower gate electrode.

The second semiconductor 130, the second gate electrode GE2, the second source electrode SE2 and the second drain electrode DE2 constitute the second transistor TR2. The second transistor TR2 may be the driving transistor connected to the light emitting diode (LED) and may be formed as the transistor including the polycrystalline semiconductor.

A first interlayer insulating layer 161 may be disposed on the second gate electrode GE2. The first interlayer insulating layer 161 may include a silicon nitride, a silicon oxide, a silicon oxynitride, or the like. The first interlayer insulating layer 161 may be formed of a multilayer in which a layer including a silicon nitride and a layer including a silicon oxide are stacked. At this time, in the first interlayer insulating layer 161, the layer including the silicon nitride may be positioned closer to the substrate SB than the layer containing the silicon oxide.

A first semiconductor 135 may be disposed on the first interlayer insulating layer 161. The first semiconductor 135 may overlap the metal layer BML.

The first semiconductor 135 may include the oxide semiconductor. The oxide semiconductor may include at least one of indium (In) oxide, tin (Sn) oxide, zinc (Zn) oxide, hafnium (Hf) oxide, and aluminum (Al) oxide. For example, the first semiconductor 135 may include Indium-Gallium-Zinc Oxide (IGZO).

The first semiconductor 135 may include a channel area 137, and a source area 136 and a drain area 138 positioned on both sides of the channel area 137. The source area 136 of the first semiconductor 135 may be connected to the first source electrode SE1, and the drain area 138 of the first semiconductor 135 may be connected to the first drain electrode DE1.

A third gate insulating layer 143 may be positioned on the first semiconductor 135. The third gate insulating layer 143 may include a silicon nitride, a silicon oxide, a silicon oxynitride, and the like.

In the illustrated exemplary embodiment, the third gate insulating layer 143 may be positioned over the first semiconductor 135 and the first interlayer insulating layer 161. Accordingly, the third gate insulating layer 143 covers the upper and side surfaces of the source area 136, the channel area 137 and the drain area 138 of the first semiconductor 135.

If the third gate insulating layer 143 does not cover the upper surface of the source area 136 and the drain area 138, some material of the first semiconductor 135 may move to the side surface of the third gate insulating layer 143. In the present exemplary embodiment, since the third gate insulating layer 143 is positioned on the entire surface of the first semiconductor 135 and the first interlayer insulating layer 161, a short circuit between the first semiconductor 135 and the first gate electrode GE1 due to a diffusion of metal particles may be prevented.

However, exemplary embodiments are not limited thereto, and the third gate insulating layer 143 may not be positioned on the entire surface of the first semiconductor 135 and the first interlayer insulating layer 161. For example, the third gate insulating layer 143 may only be positioned between the first gate electrode GE1 and the first semiconductor 135. That is, the third gate insulating layer 143 may overlap the channel area 137 of the first semiconductor 135 and may not overlap the source area 136 and the drain area 138. Through this, the length of the semiconductor channel may be reduced in the process of implementing high resolution.

A first gate electrode GE1 may be positioned on the third gate insulating layer 143.

The first gate electrode GE1 may overlap the channel area 137 of the first semiconductor 135 in the direction vertical to the substrate SB. The first gate electrode GE1 may include molybdenum (Mo), aluminum (Al), copper (Cu), and/or titanium (Ti), and may have a single layer or multi-layered structure including the same. For example, the first gate electrode GE1 may include a lower layer including titanium and an upper layer including molybdenum, and the lower layer including titanium prevents the diffusion of fluorine (F), which is an etching gas when dry-etching the upper layer.

The first semiconductor 135, the first gate electrode GE1, the first source electrode SE1, and the first drain electrode DE1 constitute the first transistor TR1. The first transistor TR1 may be a switching transistor for switching the second transistor TR2, and may be made of a transistor including an oxide semiconductor.

A second interlayer insulating layer 162 may be disposed on the first gate electrode GE1. The second interlayer insulating layer 162 may include a silicon nitride, a silicon oxide, a silicon oxynitride, and the like. The second interlayer insulating layer 162 may be formed of multiple layers in which a layer containing the silicon nitride and a layer containing the silicon oxide are stacked.

A first source electrode SE1 and a first drain electrode DE1, and a second source electrode SE2 and a second drain electrode DE2, may be disposed on the second interlayer insulating layer 162. The first source electrode SE1, the first drain electrode DE1, the second source electrode SE2, and the second drain electrode DE2 may include aluminum (Al), molybdenum (Mo), titanium (Ti), tungsten (W), and/or copper (Cu), etc., and may have a single layer or multi-layered structure including the same. For example, the first source electrode SE1, the first drain electrode DE1, the second source electrode SE2, and the second drain electrode DE2 may be a triple-layer structure of a lower layer including a refractory metal such as titanium, molybdenum, chromium, tantalum, or alloys thereof, a middle layer having low resistivity such as an aluminum-based metal, and a silver-based metal, a copper-based metal, and an upper layer including a refractory metal such as titanium, molybdenum, chromium, and tantalum.

The first source electrode SE1 may be connected to the source area 136 of the first semiconductor 135, and the first drain electrode DE1 may be connected to the drain area 138 of the first semiconductor 135.

The second source electrode SE2 may be connected to the source area 131 of the second semiconductor 130, and the second drain electrode DE2 may be connected to the drain area 133 of the second semiconductor 130.

A first insulating layer 170 may be disposed on the first source electrode SE1, the first drain electrode DE1, the second source electrode SE2, and the second drain electrode DE2. The first insulating layer 170 may be an organic layer or an inorganic layer. For example, the first insulating layer 170 may include an organic insulating material such as a generally-used polymer such as polymethylmethacrylate (PMMA) or polystyrene (PS), a polymer derivative having a phenol-based group, an acryl-based polymer, an imide-based polymer, a polyimide, an acryl-based polymer, and a siloxane-based polymer.

A connection electrode CE, a data line 171, and a driving voltage line 172 may be positioned on the first insulating layer 170. The connection electrode CE and the data line DL may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu), and the like, and may have a single layer or multi-layered structure including the same.

The connection electrode CE is connected to the second drain electrode DE2.

A second insulating layer 180 may be positioned on the first insulating layer 170, the connection electrode CE, and the data line DL. The second insulating layer 180 may play a role of flattening and removing steps in order to increase emission efficiency of an emission layer to be formed thereon. The second insulating layer 180 may include an organic insulating material such as a generally-used polymer such as polymethylmethacrylate (PMMA) or polystyrene (PS), a polymer derivative having a phenol-based group, an acryl-based polymer, an imide-based polymer, a polyimide, an acryl-based polymer, and a siloxane-based polymer.

A pixel electrode 191 may be positioned on the second insulating layer 180. The pixel electrode 191 may be connected to the second drain electrode DE2 through a contact hole of the second insulating layer 180.

The pixel electrode 191 may be provided individually for each pixel PX. The pixel electrode 191 may include metals such as silver (Ag), lithium (Li), calcium (Ca), aluminum (Al), magnesium (Mg), and gold (Au), and may also contain a transparent conductive oxide (TCO) such as indium tin oxide (ITO) and indium zinc oxide (IZO). The pixel electrode 191 may be formed of a single layer including a metal material or a transparent conductive oxide, or multiple layers including these. For example, the pixel electrode 191 may have a triple layer structure of indium tin oxide (ITO)/silver (Ag)/indium tin oxide (ITO).

A pixel definition layer 350 may be positioned on the pixel electrode 191. The pixel definition layer 350 may include an organic insulating material such as a generally-used polymer such as polymethylmethacrylate (PMMA) or polystyrene (PS), a polymer derivative having a phenol-based group, an acryl-based polymer, an imide-based polymer, polyimide, an acryl-based polymer, and a siloxane-based polymer. The pixel definition layer 350 may not transmit light by including a black dye.

Pixel openings 365A, 365B, and 365C are formed in the pixel definition layer 350, and the pixel openings 365A, 365B, and 365C of the pixel definition layer 350 may overlap the pixel electrode 191. Emission layers 370A, 370B, and 370C may be disposed in the pixel openings 365A, 365B, and 365C of the pixel definition layer 350.

The emission layers 370A, 370B, and 370C may include a material layer that uniquely emits light of basic colors such as red, green, and blue. The emission layers 370A, 370B, and 370C may have a structure in which a plurality of material layers emitting light of different colors are stacked.

For example, the emission layers 370A, 370B, and 370C may be organic emission layers, and the organic emission layers include one or more of an emission layers, a hole-injection layer (HIL), a hole-transporting layer (HTL), an electron-transporting layer (ETL), and an electron-injection layer (EIL). When the organic emission layer includes all of these, the hole injection layer may be positioned on the pixel electrode 191 of the anode, and the hole transport layer, the emission layer, the electron transport layer, and the electron injection layer may be sequentially stacked thereon.

A common electrode 270 may be positioned on the emission layers 370A, 370B, and 370C and the pixel definition layer 350. The common electrode 270 may be provided in common to all pixels PX, and the common voltage ELVSS may be applied through the common voltage transmitting part 27 of the non-display area PA.

The common electrode 270 may include a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), calcium (Ca), etc., or a transparent conductive oxide (TCO) such as indium tin oxide (ITO) and indium zinc oxide (IZO).

The pixel electrode 191, the emission layers 370A, 370B, and 370C, and the common electrode 270 may form the light emitting diode (LED). Here, the pixel electrode 191 may be an anode, which is a hole injection electrode, and the common electrode 270 may be a cathode, which is an electron injection electrode. However, in an exemplary embodiment, the pixel electrode 191 may be the cathode and the common electrode 270 may be the anode according to the driving method of the organic light emitting diode display.

Each hole and electron from the pixel electrode 191 and the common electrode 270 are injected into the emission layer 370, and an exciton that is formed by the injected hole and the electron combine falls from an excited state to a ground state, thereby causing light emission.

The first transistor TR1, which is a part of the switching transistor of the display device according to the exemplary embodiment, may include the oxide semiconductor, and the second transistor TR2, which is a part of the driving transistor, may include the polycrystalline semiconductor. For high-speed driving, the movement of a motion picture may be expressed more naturally by increasing the frequency of about 60 Hz to about 120 Hz, but this increases power consumption. The frequency when driving a still image may be lowered to compensate for the increased power consumption. For example, when driving the still image, it may be driven at about 1 Hz. If the frequency is lowered in this way, a leakage current may occur. In the display device according to an exemplary embodiment, the leakage current may be minimized by making the first transistor TR1, which is the switching transistor, include the oxide semiconductor. In addition, since the second transistor TR2, which is the driving transistor, includes the polycrystalline semiconductor, high electron mobility may be achieved. In other words, by making the switching transistor and the driving transistor include the different semiconductor materials, it is possible to drive more stably and have high reliability.

An encapsulation layer 600 is positioned on the common electrode 270. The encapsulation layer 600 may seal the display unit 1000 by covering not only the upper surface but also the side surface of the display unit 1000. The encapsulation layer 600 is positioned on the entire surface of the display area DA and the end of the encapsulation layer 600 may be positioned in the non-display area PA by extending from the display area DA.

Since the emission layer such as the organic light emitting element is very vulnerable to moisture and oxygen, the encapsulation layer 600 seals the display unit 1000 to block inflow of moisture and oxygen from outside. The encapsulation layer 600 may include a plurality of layers and may be formed as a composite layer including both an inorganic layer and an organic layer. For example, the encapsulation layer 600 may be formed as a triple layer in which a first encapsulation inorganic film, an encapsulation organic film, and a second encapsulation inorganic film are sequentially formed, the first encapsulation inorganic film and the second encapsulation inorganic film may include an inorganic material, and the encapsulation organic film may include an organic material.

A touch unit 2000 is disposed on the encapsulation layer 600.

The touch unit 2000 is described briefly. A third insulating layer 710 is positioned on the encapsulation layer 600. The third insulating layer 710 may include at least one among a metal oxide, a metal oxynitride, a silicon oxide, a silicon nitride, and a silicon oxynitride, and the organic layer may be formed of polymer series materials, however it is not limited thereto. The third insulating layer 710 may cover the encapsulation layer 600 to protect the encapsulation layer 600 and prevent moisture permeation. In addition, the third insulating layer 710 may reduce a parasitic capacitance between the common electrode 270 and the touch electrode.

A first touch cell connection part 452 is disposed on the third insulating layer 710, and a fourth insulating layer 720 is disposed on the first touch cell connection part 452. The fourth insulating layer 720 may be formed of an inorganic or organic layer such as a metal oxide, a metal oxynitride, a silicon oxide, a silicon nitride, and a silicon oxynitride.

A first touch cell TE is positioned on the fourth insulating layer 720. In addition, although not shown, a second touch cell and a second touch cell connection part may also be positioned on the fourth insulating layer 720. At this time, one of the first touch cell TE and the second touch cell may be a sensing input electrode, and the other may be a sensing output electrode. The first touch cell TE and the second touch cell may be electrically separated from each other, and may be dispersed so as to not overlap each other and may be disposed in a mesh form. The first touch cells TE may be connected to each other by the first touch cell connection part 452, and the second touch cells may be connected to each other by the second touch cell connection part.

A touch cell passivation layer 430 may be positioned on the first touch cell TE and the second touch cell (not shown). The touch cell passivation layer 430 may protect the first touch cell TE and the second touch cell (not shown) by covering the first touch cell TE and the second touch cell (not shown) so that they are not exposed to the outside. The touch cell passivation layer 430 may include inorganic materials such as a silicon nitride (SiNx) or silicon oxide SiO2, a polyacrylate resin, a polyimide resin, and an acryl-based organic material.

An antireflection unit 3000 is positioned on the touch unit 2000.

The antireflection unit 3000 includes a light blocking layer 520 and color filters 530A, 530B, and 530C.

The light blocking layer 520 overlaps the pixel definition layer 350 of the display unit 1000 and may have the narrower width than the pixel definition layer 350. The light blocking layer 520 may be positioned over the entire non-display area NA (FIG. 1).

The light blocking layer 520 has a plurality of openings 521 overlapping the pixel opening 365 of the pixel definition layer 350, and each opening 521 overlaps the pixel opening 365. The width of the opening 521 of the light blocking layer 520 may be wider than the width of each overlapping pixel opening 365.

The color filters 530A, 530B, and 530C are disposed on the light blocking layer 520. Most of each color filter 530A, 530B, and 530C is disposed in the opening 521 of the light blocking layer 520. A fifth insulating layer 540 may be positioned on a plurality of color filters 530A, 530B, and 530C.

The antireflection unit 3000 prevents the external light incident from the outside from being reflected and recognized by wiring. The light blocking layer 520 of the antireflection unit 3000 is positioned so as to overlap the non-display area PA and the edge of the light emitting area of the display area DA, thereby absorbing incident external light and reducing it being incident on the light emitting area. As a result, the degree to which the external light is reflected and visually recognized may be reduced.

The color filters 530A, 530B, and 530C of the antireflection unit 3000 reduce the visibility by being reflected after the external light incident from the outside is incident on the pixel definition layer 350, etc. Since the color filters 530A, 530B, and 530C do not completely block light, it is possible to prevent the reflection of the external light from being recognized as visible without reducing the efficiency of light emitted from the emission layer 370.

In general, a polarization layer may be used to prevent the recognition of reflected light from external light, but this lowers the efficiency of light emitted from the emission layer. However, according to an exemplary embodiment, it is possible to prevent the reflection of the external light from being recognized without reducing the efficiency of light emitted from the emission layer 370 through the antireflection unit 3000.

Next, referring to FIG. 9, the second display area DA2 of the display device according to an exemplary embodiment includes the second pixel area PA2 and the transmission area TA capable of displaying the image, and the wiring area WA disposed around the second pixel area PA2.

The interlayer structure of the second pixel area PA2 capable of displaying the image is similar to the interlayer structure of the first pixel area PA1 of the display device according to the exemplary embodiment described with reference to FIG. 8. A detailed description of the same constituent elements is omitted.

As shown in FIG. 9, the metal blocking layer BL is disposed on the second barrier layer 1101. The metal blocking layer BL may prevent light from the lower part of the substrate 110 from inflowing and being recognized. Particularly, the metal blocking layer BL is positioned in the second pixel area PA2 and the wiring area WA except for the transmission area TA to prevent the light leakage around the transmission area TA, thereby preventing the performance deterioration of the electronic device positioned below the transmission area TA due to an unnecessary external light.

The metal blocking layer BL may include an organic material, a metal oxide, or a metal, which includes a material having a black color.

A buffer layer 111 may be positioned on the second barrier layer 1101 and the metal blocking layer BL.

The configurations from the buffer layer 111 to the fifth insulating layer 540 are the same as the configurations according to the exemplary embodiment shown in FIG. 8.

The light blocking layer 520 may have an opening overlapping the emission layer 370, and the color filter 530 may be positioned at the opening of the light blocking layer 520. The light blocking layer 520 positioned at the edge of the second pixel area PA2 extends toward the wiring area WA side to form a light blocking layer BM that is more extended than the edge of the metal blocking layer BL.

The metal blocking layer BL positioned in the second pixel area PA2 is also positioned in the wiring area WA. The gate line GL and the data line DL may be disposed in the wiring area WA.

The transmission area TA may include a first transmission area TA1 formed by the edge part of the metal blocking layer BL disposed in the second pixel area PA2 and a second transmission area TA2 formed by the edge part of the light blocking layer BM positioned in the second pixel area PA2.

On a plane, the light blocking layer BM may be extended more than the edge of the metal blocking layer BL, the area of the second transmission area TA2 may be narrower than the area of the first transmission area TA1, and the area of the opening OPN of the transmission area TA may be almost the same as the area of the second transmission area TA2.

In the first transmission area TA1, a plurality of insulating layers 141, 142, 143, 161, and 162 disposed in the second pixel area PA2 may be removed, but the parts of a plurality of insulating layers 141, 142, 143, 161, and 162 may be disposed at the side of the metal blocking layer BL.

By covering and protecting the side of the blocking layer BL with the portion of a plurality of insulating layers 141, 142, 143, 161, and 162, it is possible to prevent the metal blocking layer BL from being corroded during the manufacturing process.

The transmission areas TA1 and TA2 having the opening OPN where the metal blocking layer BL and the light blocking layer BM disposed in the second pixel area PA2 are removed is disposed, and light may be transmitted through an optical device (not shown) that may be disposed on the rear of the substrate SB. The optical device may be a sensor, a camera, a flash, or the like.

At this time, due to a difference in a film thickness and a film characteristic of a plurality of insulating layers 141, 142, 143, 161, and 162 positioned at the edge of the first transmission area TA1, light is diffracted or scattered, and then may be recognized from the outside, and as a result, the performance of the optical device may be deteriorated.

However, in the display device according to an exemplary embodiment, on a plane, the edge of the light blocking layer BM is protruded more than the edge of the metal blocking layer BL, and the edge of the insulating layers 141, 142, 143, 161, and 162 disposed around the edge of the metal blocking layer BL may be covered, thereby preventing light around of the edge of the metal blocking layer BL from being recognized due to the diffusion and scattering.

The metal blocking layer BL and the light blocking layer BM, and the shape of the opening OPN of the transmission area TA according to the above-described exemplary embodiment, are all applicable to the present exemplary embodiment.

The encapsulation layer 600 described above is positioned in the entire area including the light emitting diodes (LED) of the display areas DA1 and DA2, the pixel definition layer 350, and the transmission area TA to cover the entire surface of the substrate SB.

The first insulating layer 170 and the second insulating layer 180 also remain in the transmission area TA, thus helping to planarize the layers positioned under the encapsulation layer 600.

As such, the first insulating layer 170 and the second insulating layer 180 remain in the transmission areas TA1 and TA2, thereby increasing the flatness of the transmission areas TA1 and TA2, accordingly thereby improving the optical characteristics of the optical device.

As above-described, the edge of the light blocking layer BM of the transmission areas TA1 and TA2 is protruded more than the edge of the metal blocking layer BL.

On a plane, a first interval d1 between the edge of the metal blocking layer BL and the edge of the light blocking layer BM may be longer than a second interval d2 as a minimum interval between the edge of the gate line GL of the wiring area WA and the edge of the metal blocking layer BL, and a third interval d3 as a minimum interval between the edge of the data line DL of the wiring area WA and the edge of the metal blocking layer BL. Also, on a plane, the first interval d1 between the edge of the metal blocking layer BL and the edge of the light blocking layer BM may be narrower than a fourth interval d4 as a minimum interval between the edge of the pixel definition layer 350 and the edge of the metal blocking layer BL.

As the edge of the light blocking layer BM of the transmission areas TA1 and TA2 is protruded more than the edge of the metal blocking layer BL, the edge of the insulating layers 141, 142, 143, 161, and 162 disposed around the edge of the metal blocking layer BL may be covered, and on a plane, the first interval d1 between the edge of the metal blocking layer BL and the edge of the light blocking layer BM may be wider than a fifth interval d5 as a minimum between edges of the metal blocking layer BL and the insulating layers 141, 142, 143, 161, and 162.

As such, the display device according to the present exemplary embodiment prevents the recognition of the reflected light of the external light through the antireflection unit including the light blocking layer 520 and the color filter 530, without reducing the efficiency of light emitted from the emission layer 370, so it is possible to prevent the reflected light of the external light from being visually recognized.

The antireflection unit including the light blocking layer 520 and the color filter 530 is removed from the transmission area TA of the second display area DA2, thereby improving the efficiency of the optical device.

Also, the metal blocking layer BL blocks the light incident under the substrate SB, that is, the rear side of the substrate SB, so that the optical device disposed at the rear of the substrate SB of the transmission area TA may be easily recognized, thereby increasing an optical characteristic of the optical device, and the light blocking layer BM extending more than the edge of the metal blocking layer BL among the light blocking layer 520 of the antireflection unit may cover the edge of the insulating layers 141, 142, 143, 161, and 162 disposed around the edge of the metal blocking layer BL, and accordingly, it is possible to prevent the light from being diffracted and scattered around the edge of the metal blocking layer BL from being visually recognized.

In addition, the first insulating layer 170 and the second insulating layer 180 also remain in the transmission area TA, thereby increasing the flatness of the transmission areas TA1 and TA2, thereby improving optical characteristics of the optical device.

Figure 10:
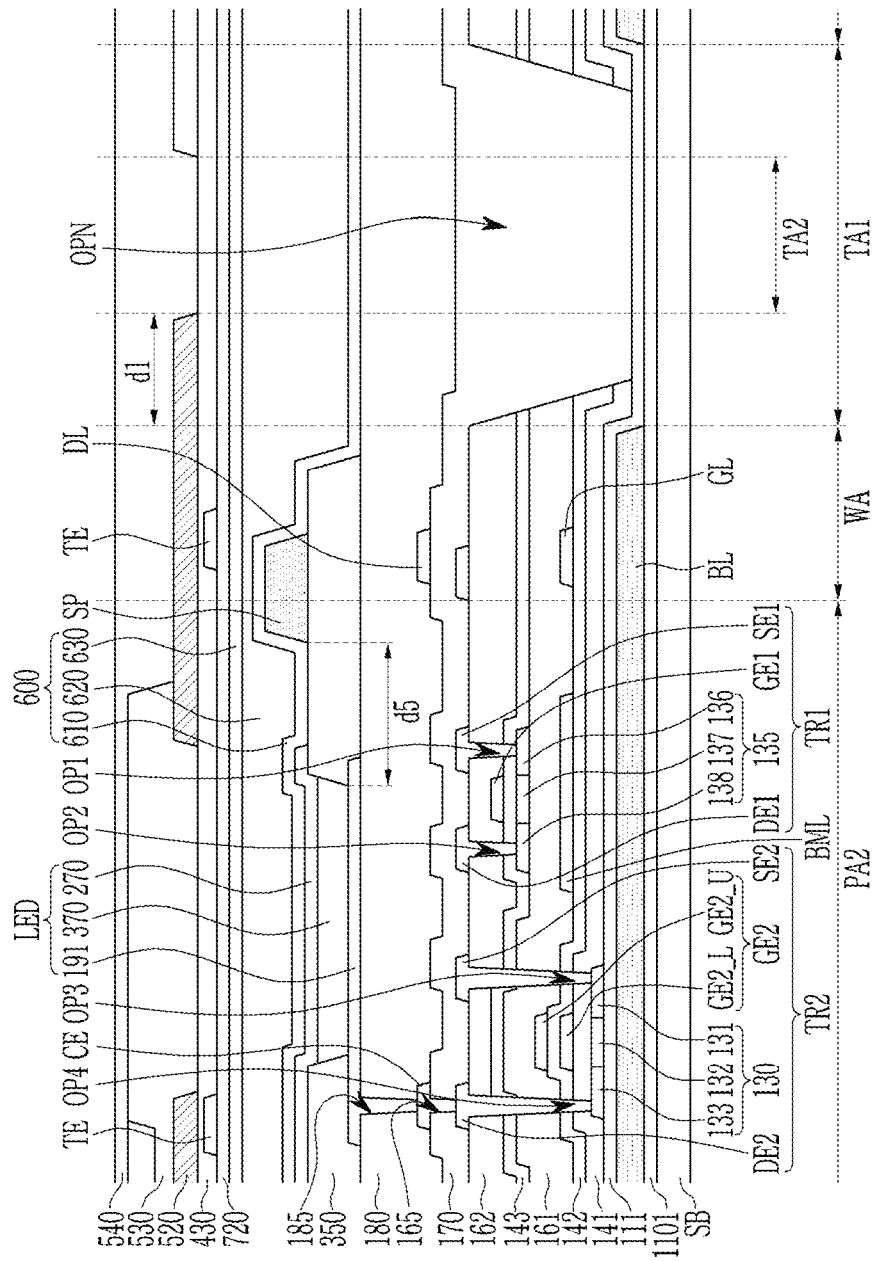
FIG. 10 is a cross-sectional view of a second display area of a display device according to another exemplary embodiment.

Next, the second display area of the display device according to another exemplary embodiment is described with reference to FIG. 10. FIG. 10 is a cross-sectional view of a second display area of a display device according to another exemplary embodiment. The second display area of the display device according to the present exemplary embodiment is similar to the second display area of the display device according to the exemplary embodiment described with reference to FIG. 8 and FIG. 9. A detailed description of the same constituent elements is omitted.

Referring to FIG. 10, the second display area of the display device according to the present exemplary embodiment may further include a spacer SP disposed on the pixel definition layer 350, unlike the second display area of the display device according to the exemplary embodiment shown in FIG. 9.

The spacer SP may be disposed on the pixel definition layer 350, on a plane, and may be disposed between the second pixel area PA2 and the transmission area TA.

The spacer SP may include an organic material.

The spacer SP supports a mask used in a subsequent process, thereby preventing defects from occurring in the emission layer 370 due to sagging of the mask.

As above-described, the spacer SP is disposed on the pixel definition layer 350, on a plane, between the second pixel area PA2 and the transmission area TA, on a plane, and a sixth interval d6 as a minimum interval between the spacer SP and the emission layer 370 may be about 7 μm or more.

If the sixth interval d6 between the spacer SP and the emission layer 370 is close, a lifetime of the emission layer 370 may be deteriorated by outgassing that may occur in the spacer SP including an organic material.

In general, the spacer SP is formed between the emission layers 370 adjacent to each other, and in this case, it is difficult to achieve a predetermined interval between the spacer SP and the emission layer 370, so that the lifetime of the emission layer 370 may be deteriorated due to the outgassing that may occur in the spacer SP. In addition, since the interval between the emission layers 370 adjacent to each other is narrow, it may be difficult to secure an area in which a spacer SP may be formed, and it may be difficult to form the spacer SP having a constant thickness.

However, according to the display device according to the exemplary embodiment, since the spacer SP is not disposed between the adjacent emission layers 370 of the second pixel area PA2 and is disposed between the second pixel area PA2 and the transmission area TA, on a plane, the sixth interval d6 as a minimum interval between the spacer SP and the emission layer 370 may be maintained at about 7 μm or more, and the area where the spacer SP may be formed is relatively wide, thereby forming the spacer SP of the desired thickness.

Many features of the display device according to the exemplary embodiment described above are applicable to the display device according to the present exemplary embodiment.

Figure 11:
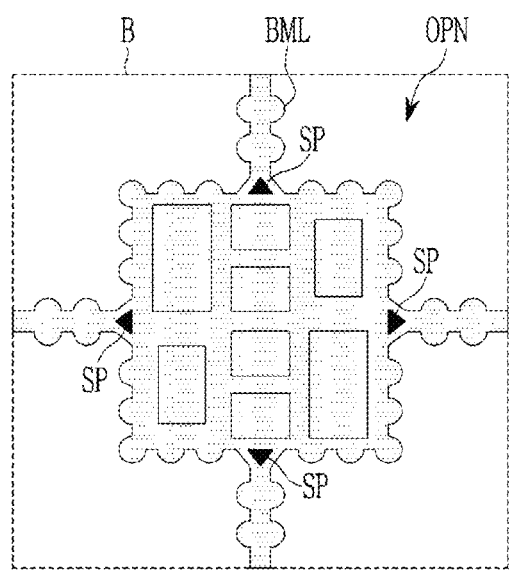
FIGS. 11, 12, and FIG. 13 are schematic enlarged views of a second pixel area of a display device according to another exemplary embodiment.
Figure 12:
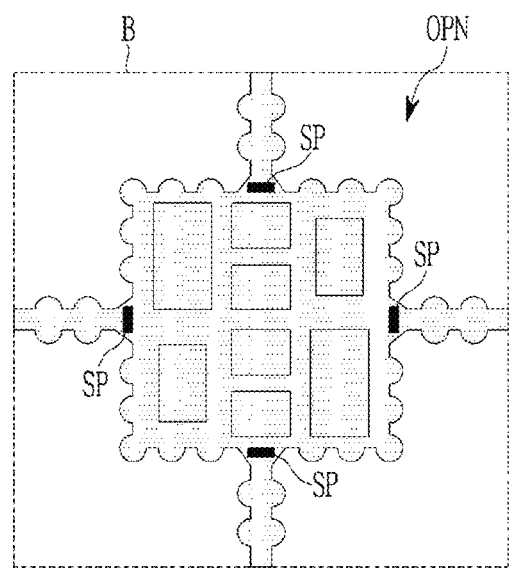
Figure 13:
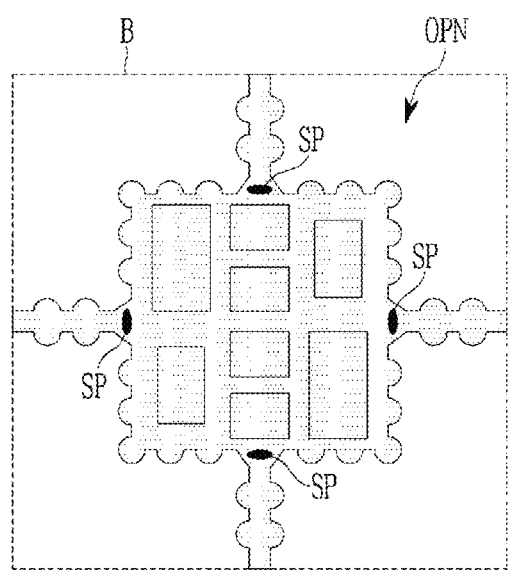
Figure 14:
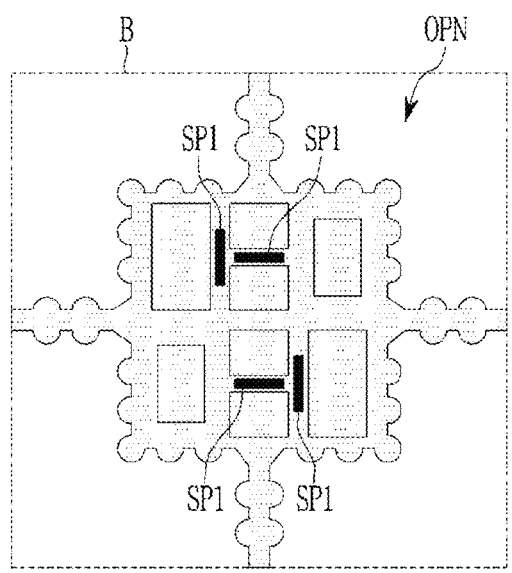
FIG. 14 is a schematic enlarged view of a second pixel area of a display device according to a conventional art.

Next, the position and shape of the spacer SP of the display device according to the exemplary embodiment are described in more detail with reference to FIG. 14 along with FIG. 11 to FIG. 13. FIG. 11 to FIG. 13 are schematic enlarged views of a second pixel area of a display device according to another exemplary embodiment, and FIG. 14 is a schematic enlarged view of a second pixel area of a display device according to a conventional art. FIG. 11 to FIG. 13 are the views enlarging the area B of FIG. 5.

Referring to FIG. 11, the spacer SP is disposed between the second pixel area PA2 of the second display area DA2 and the transmission area TA having the opening OPN. The spacer SP is disposed adjacent to the edge of the metal blocking layer BL.

The spacer SP may have a planar shape in the form of an approximate triangle.

As the spacer SP is disposed between the second pixel area PA2 of the second display area DA2 and the transmission area TA having the opening OPN, like the conventional art of FIG. 14, compared with a case that the spacer SP1 is disposed between the pixels PX of the second pixel area PA2 of the second display area DA2, the interval between the spacer SP and the pixel PX may be sufficiently maintained, and the area of the part where the spacer is formed is wide, thereby easily forming the shape of the spacer SP having the predetermined thickness.

As the spacer SP is disposed between the second pixel area PA2 of the second display area DA2 and the transmission area TA having the opening OPN, the interval between the spacer SP and the pixel PX may be sufficiently maintained, thereby preventing the quality deterioration of the emission layer due to the outgassing that may be generated in the spacer SP.

Next, referring to FIG. 12, the spacer SP is disposed between the second pixel area PA2 of the second display area DA2 and the transmission area TA having the opening OPN. The spacer SP is disposed adjacent to the edge of the metal blocking layer BL.

The spacer SP may have a planar shape in the form of an approximate quadrangle.

As the spacer SP is disposed between the second pixel area PA2 of the second display area DA2 and the transmission area TA having the opening OPN, the interval between the spacer SP and the pixel PX may be sufficiently maintained, thereby preventing the quality deterioration of the emission layer due to the outgassing that may be generated in the spacer SP, and the area where the spacer is formed is wide, thereby easily forming the spacer SP shape having the predetermined thickness.

The shape of the spacer SP shown in FIG. 11 and FIG. 12 is an example, and the shape of the spacer of the display device according to the exemplary embodiment is not limited thereto and may be modified to have the planar shape of a predetermined polygonal shape.

Next, referring to FIG. 13, the spacer SP is disposed between the second pixel area PA2 of the second display area DA2 and the transmission area TA having the opening OPN. The spacer SP is disposed adjacent to the edge of the metal blocking layer BL.

The spacer SP may have a planar shape of an approximate ellipse shape.

As the spacer SP is disposed between the second pixel area PA2 of the second display area DA2 and the transmission area TA having the opening OPN, the interval between the spacer SP and the pixel PX may be sufficiently maintained, thereby preventing the quality deterioration of the emission layer due to the outgassing that may be generated in the spacer SP, and the area where the spacer is formed is wide, thereby easily forming the spacer SP shape having the predetermined thickness.

The shape of the spacer SP shown in FIG. 13 is an example, and the shape of the spacer of the display device according to the exemplary embodiment is not limited thereto and may be modified to have a planar shape of various curved shapes such as a circle.

As above-described, in the display device according to a conventional art shown in FIG. 14, the spacer SP1 is disposed between the pixels PX between the second pixel areas PA2 of the second display area DA2. Like this, when the spacer SP1 is disposed between the pixels PX of the second pixel areas PA2 of the second display area DA2, it is difficult to maintain the sufficient interval between the spacer SP and the pixel PX, so it is difficult to prevent the quality deterioration of the emission layer due to the outgassing that may occur in the spacer SP, and as the area of the portion where the spacer is formed is narrowed, it is difficult to form the spacer SP1 having a predetermined thickness.

Figure 15:
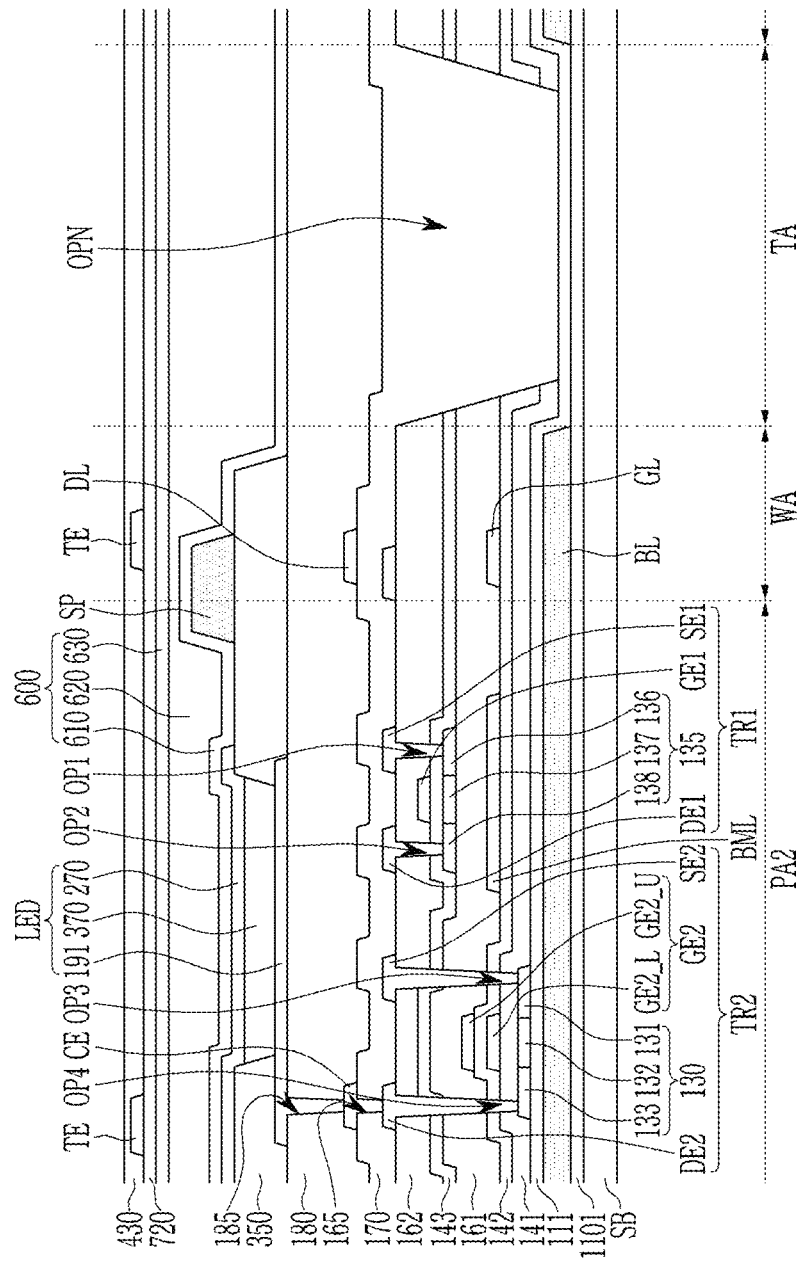
FIG. 15 is a cross-sectional view of a second display area of a display device according to another exemplary embodiment.

Next, the second display area of the display device according to another exemplary embodiment is described with reference to FIG. 15. FIG. 15 is a cross-sectional view of a second display area of a display device according to another exemplary embodiment. The second display area of the display device according to the present exemplary embodiment is similar to the second display area of the display device according to the exemplary embodiment described with reference to FIG. 10. A detailed description of the same constituent elements is omitted.

Referring to FIG. 15, the second display area of the display device according to the present exemplary embodiment may include the spacer SP disposed on the pixel definition layer 350.

The spacer SP may be disposed on the pixel definition layer 350, on a plane, and may be disposed between the second pixel area PA2 and the transmission area TA. Many features of the spacer SP of the display device according to the exemplary embodiment described with reference to FIG.

10 above are applicable all of the spacer SP of the display device according to the present exemplary embodiment, and thus a detailed description of the spacer SP is omitted.

Unlike the display device according to the exemplary embodiment described with reference to FIG. 10, according to the display device according to the present exemplary embodiment, the antireflection unit including the light blocking layer 520 and the color filter 530 may not be included.

Many features of the display device according to the exemplary embodiment described above are all applicable to the display device according to the present exemplary embodiment.

Figure 16:
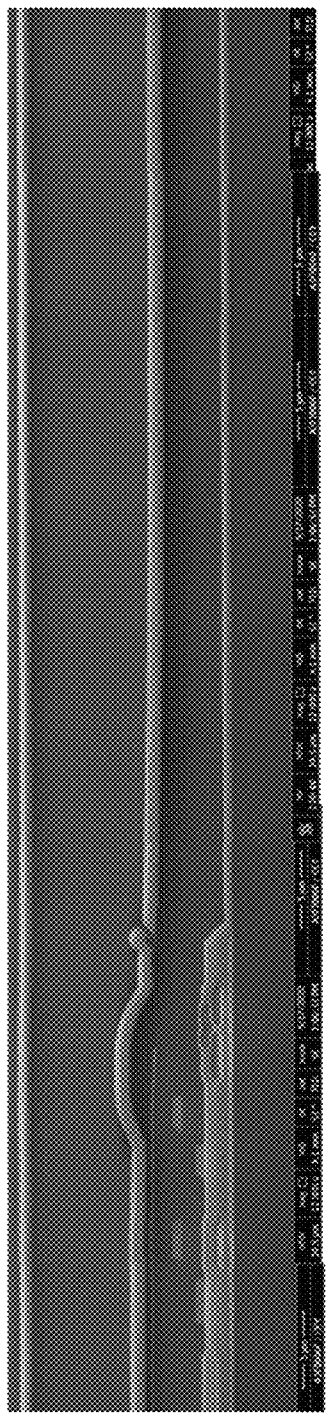
FIG. 16 is an image showing a result of an experimental example.

Next, an experimental example is described with reference to FIG. 16 and FIG. 17. FIG. 16 is an image showing a result of an experimental example, and FIG. 17 is a graph showing a result of an experimental example.

In the present experimental example, like the display device according to the exemplary embodiment, in the transmission area TA of the second display area DA2, the first insulating layer 170 and the second insulating layer 180 are not removed, after forming the first insulating layer 170 and the second insulating layer 180 in the transmission area TA, and whether the surface is flattened in the transmission area TA of the second display area DA2 is measured with an electron micrograph and a result thereof is shown in FIG. 16. Also, for a first case a that the first insulating layer 170 and the second insulating layer 180 are removed in the transmission area TA of the second display area DA2, like the display device according to an exemplary embodiment, second cases b, c, and d without removing the first insulating layer 170 and the second insulating layer 180 in the transmission area TA of the second display area DA2, a MTF (Modulation Transfer Function) of the optical device was measured, and a result thereof is shown in FIG. 17.

Referring to FIG. 16, like the display device according to the exemplary embodiment, in the case that the first insulating layer 170 and the second insulating layer 180 are not removed from the transmission area TA of the second display area DA2, and the first insulating layer 170 and the second insulating layer 180 are also formed in the transmission area TA, it may be confirmed that the planarization was well performed.

Figure 17:
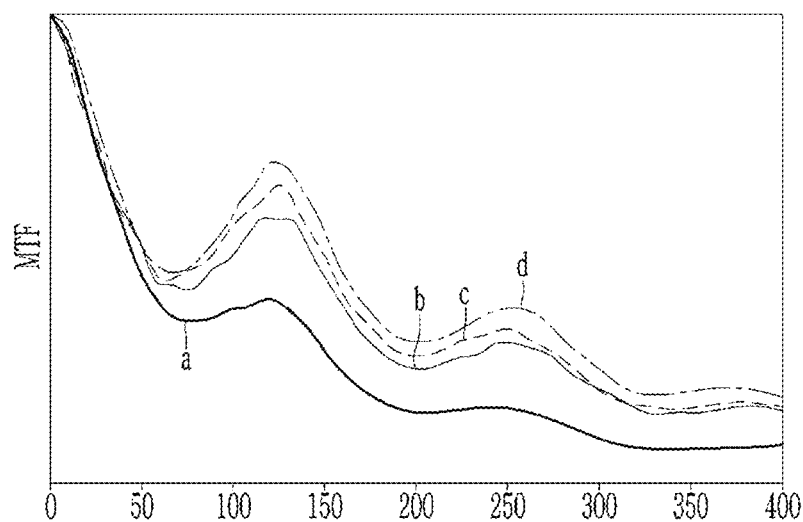
FIG. 17 is a graph showing a result of an experimental example.

Referring to FIG. 17, compared with the first case a that the first insulating layer 170 and the second insulating layer 180 are removed in the transmission area TA of the second display area DA2, in the second cases b, c, and d that the first insulating layer 170 and the second insulating layer 180 are not removed in the transmission area TA of the second display area DA2 like the display device according to the exemplary embodiment, it may be confirmed that the MTF of the optical device was excellent.

Figure 18:
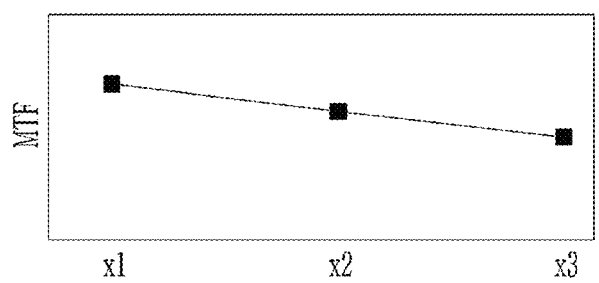
FIG. 18 is a graph showing a result of another experimental example.

Next, another experimental example is described with reference to FIG. 18. FIG. 18 is a graph showing a result of another experimental example.

In the present experimental example, like the display device according to the exemplary embodiment, for a case x1 that the light blocking layer BM disposed in the transmission area TA of the second display area DA2 is formed to be extended than the metal blocking layer BL, but it is to be more protruded than the edge of the insulating layers positioned on the side of the metal blocking layer BL, a case x2 that the light blocking layer BM disposed in the transmission area TA of the second display area DA2 is formed to be extended more than the metal blocking layer BL, but it is formed to overlap the edge of the insulating layers disposed at the side of the metal blocking layer BL and the edge of the light blocking layer BM vertically, and a case x3 that the edge of the light blocking layer BM disposed in the transmission area TA of the second display area DA2 and the edge of the metal blocking layer BL are formed to be overlapped vertically, the MTF of the optical device was measured and a result thereof is shown in FIG. 18.

Referring to FIG. 18, like the display device according to the exemplary embodiment, in the case x1 that the light blocking layer BM positioned on the transmission area TA of the second display area DA2 is formed to be extended more than the metal blocking layer BL, but it is formed to be more protruded than the edge of the insulating layers positioned on the side of the metal blocking layer BL, it may be confirmed that the MTF of the optical device was better.

Figure 19:
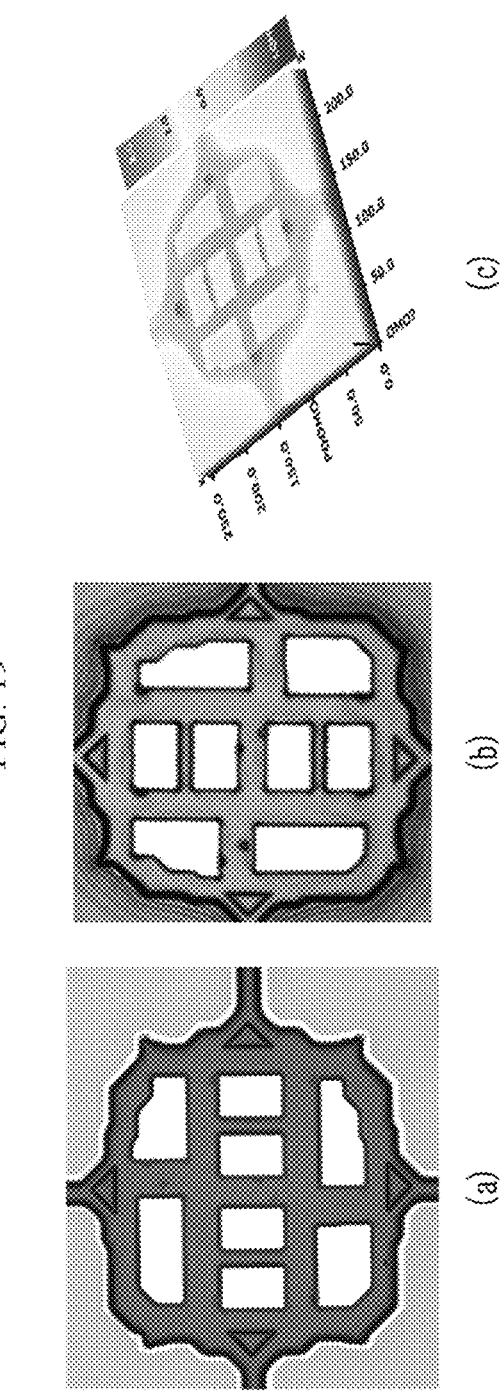
FIG. 19 is an image showing a result of another experimental example.

Next, another experimental example is described with reference to FIG. 19. FIG. 19 is an image showing a result of another experimental example.

In the present experimental example, like the display device according to the exemplary embodiment, on a plane, the spacer SP positioned between the second pixel area PA2 and the transmission area TA is formed, and a result thereof was measured by an electron micrograph, a 3D profile photo, and a 3D graph, and results thereof are shown in FIG. 19. In FIG. 19, (a) is an electron micrograph, (b) is a three-dimensional profile picture, and (c) is a three-dimensional graph.

Referring to FIG. 19, similar to that shown in FIG. 11, it may be confirmed that the spacer SP has a desired planar shape and is well formed with a predetermined thickness.

While this disclosure has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

What is claimed is:

1. A display device comprising:
   a substrate including a display area and a transmission area;
   a metal blocking layer disposed in the display area;
   an inorganic insulating layer disposed on the metal blocking layer;
   a transistor disposed on the metal blocking layer;
   a light emitting layer electrically connected to the transistor;
   a light blocking layer and a color filter disposed on the light emitting layer in the display area; and
   a gate line and a data line disposed on the substrate,
   wherein an edge of the light blocking layer, an edge of the inorganic insulating layer, an edge of the metal blocking layer, and an edge of any one of the gate line and the data line move away from a center of the transmission area in that order.

2. The display device of claim 1, wherein
   the substrate further includes a wiring area disposed between the display area and the transmission area, and
   the gate line and the data line are disposed in the wiring area.

3. The display device of claim 2, wherein
   the metal blocking layer and the light blocking layer overlap at least a portion of the wiring area.

4. The display device of claim 1, wherein
   the edge of the metal blocking layer is covered with the inorganic insulating layer.

5. The display device of claim 1, further comprising:
an organic insulating layer disposed below the light emitting layer,
wherein the organic insulating layer overlaps the display area and the transmission area.

6. The display device of claim 5, wherein
the inorganic insulating layer is at least partially removed from the transmission area.

7. The display device of claim 6, wherein
the metal blocking layer has a first opening overlapping the transmission area,
the light blocking layer has a second opening overlapping the transmission area, and
a planar area of the second opening is smaller than a planar area of the first opening.

8. The display device of claim 7, wherein
a planar shape of the first opening and a planar shape of the second opening are substantially the same.

9. The display device of claim 1, further comprising:
a semiconductor layer disposed on the metal blocking layer,
a first gate insulating layer disposed on the semiconductor layer,
a first gate electrode disposed on the first gate insulating layer,
a second gate insulating layer disposed on the first gate electrode,
a second gate electrode disposed on the second gate insulating layer,
a first interlayer insulating layer disposed on the second gate electrode, and
a connection electrode positioned on the first interlayer insulating layer.

10. The display device of claim 9, wherein
the inorganic insulating layer comprises at least one of the first gate insulating layer, the second gate insulating layer, and the first interlayer insulating layer.

11. The display device of claim 9, wherein
the gate line is disposed on the same layer as at least one of the first gate electrode and the second gate electrode.

12. The display device of claim 9, wherein
the data line is disposed on the same layer as the connection electrode.

13. The display device of claim 2, further comprising:
a pixel defining layer disposed on the transistor and defining an area of the light emitting layer,
wherein the edge of the metal blocking layer protrudes toward the transmission area rather than an edge of the pixel defining layer.

14. The display device of claim 13, further comprising:
a spacer disposed on the pixel defining layer,
wherein the spacer overlaps at least a portion of the wiring area.

15. The display device of claim 14, wherein
the spacer is disposed adjacent to the edge of the metal blocking layer.

16. A display device comprising:
a substrate including a display area, a transmission area, and a wiring area disposed between the display area and the transmission area;
a metal blocking layer disposed in the display area;
an inorganic insulating layer disposed on the metal blocking layer;
a transistor disposed on the metal blocking layer;
a light emitting layer electrically connected to the transistor;
a light blocking layer and a color filter disposed on the light emitting layer in the display area; and
a gate line and a data line disposed on the wiring area,
wherein the light blocking layer protrudes more toward the transmission area than the metal blocking layer.

17. The display device of claim 16, wherein
an edge of the inorganic insulating layer is positioned between an edge of the metal blocking layer and an edge of the light blocking layer.

18. The display device of claim 16, wherein
an edge of the metal blocking layer protrudes more toward the transmission area than edges of the gate line and the data line.

19. The display device of claim 16, wherein
the inorganic insulating layer covers an edge of the metal blocking layer.

20. The display device of claim 16, wherein
the light blocking layer and the color filter are removed from the transmission area.

* * * * *